United States Patent
Ennis et al.

(10) Patent No.: US 10,677,870 B2
(45) Date of Patent: Jun. 9, 2020

(54) SYSTEM AND METHOD FOR OPTIMIZED DIFFUSION-WEIGHTED IMAGING

(71) Applicant: The Regents of The University of California, Oakland, CA (US)

(72) Inventors: Daniel B. Ennis, Manhattan Beach, CA (US); Eric Aliotta, Los Angeles, CA (US); Holden H. Wu, Los Angees, CA (US)

(73) Assignee: The Regents of the University of California, Oakland, CA (US)

( * ) Notice: Subject to any disclaimer, the term of this patent is extended or adjusted under 35 U.S.C. 154(b) by 138 days.

(21) Appl. No.: 16/072,193

(22) PCT Filed: Jan. 25, 2017

(86) PCT No.: PCT/US2017/014800
§ 371 (c)(1),
(2) Date: Jul. 24, 2018

(87) PCT Pub. No.: WO2017/132180
PCT Pub. Date: Aug. 3, 2017

(65) Prior Publication Data
US 2019/0033410 A1    Jan. 31, 2019

Related U.S. Application Data

(60) Provisional application No. 62/286,483, filed on Jan. 25, 2016.

(51) Int. Cl.
*A61B 5/00* (2006.01)
*G01R 33/561* (2006.01)
(Continued)

(52) U.S. Cl.
CPC ..... *G01R 33/561* (2013.01); *G01R 33/56341* (2013.01); *G01R 33/56509* (2013.01);
(Continued)

(58) Field of Classification Search
CPC .................. A61B 5/00; G01R 33/20
(Continued)

(56) References Cited

U.S. PATENT DOCUMENTS 9,513,358 B2 *  12/2016  Levin ............... G01R 33/56509
2005/0057249 A1  3/2005  Dale
(Continued)

OTHER PUBLICATIONS

European Patent Office, Extended European Search Report for application 17744789.3, dated Aug. 8, 2019, 9 pages.
(Continued)

*Primary Examiner* — Abolfazl Tabatabai
(74) *Attorney, Agent, or Firm* — Quarles & Brady LLP

(57) ABSTRACT

A system and method for optimized diffusion-weighted imaging is provided. In one aspect, the method includes providing a plurality of constraints for imaging a target at a selected diffusion weighting, and applying an optimization framework to generate an optimized diffusion encoding gradient waveform satisfying the plurality of constraints. The method also includes performing, using the MRI system, a pulse sequence comprising the optimized diffusion encoding gradient waveform to generate diffusion-weighted data, and generating at least one image of the target using the diffusion-weighted data.

21 Claims, 15 Drawing Sheets

(51) Int. Cl.
  G01R 33/563 (2006.01)
  G06T 7/11 (2017.01)
  G01R 33/565 (2006.01)
  G06T 7/00 (2017.01)
  G01R 33/20 (2006.01)

(52) U.S. Cl.
  CPC .............. *G06T 7/0012* (2013.01); *G06T 7/11* (2017.01); *G01R 33/5614* (2013.01); *G01R 33/5616* (2013.01); *G06T 2207/10092* (2013.01); *G06T 2207/30016* (2013.01); *G06T 2207/30048* (2013.01); *G06T 2207/30056* (2013.01)

(58) Field of Classification Search
  USPC ......................................................... 382/131
  See application file for complete search history.

(56) References Cited

U.S. PATENT DOCUMENTS

| | | |
|---|---|---|
| 2005/0077895 A1 | 4/2005 | Hargreaves |
| 2008/0088305 A1 | 4/2008 | Olson |
| 2011/0006768 A1 | 1/2011 | Ying |
| 2013/0265045 A1 | 10/2013 | Xu |

OTHER PUBLICATIONS

Alexander, A. L., et al. "Elimination of eddy current artifacts in diffusion-weighted echo-planar images: the use of bipolar gradients." Magnetic Resonance in Medicine 38.6 (1997): 1016-1021.
Aliotta, E. et al. "Convex optimized diffusion encoding (CODE) gradient waveforms for minimum echo time and bulk motion-compensated diffusion-weighted MRI." Magnetic resonance in medicine 77.2 (2017): 717-729.
Drobnjak, I., et al. "Optimizing gradient waveforms for microstructure sensitivity in diffusion-weighted MR." Journal of Magnetic Resonance 206.1 (2010): 41-51.
Aliotta E, et al, In Vivo Spin Echo EPI Cardiac Diffusion Tensor MRI Using Ultra-High Gradient Amplitudes. ISMRM; 2015; Milan, Italy.
Aliotta E, et al, Increased maximum gradient amplitude improves robustness of spin-echo cardiac diffusion-weighted MRI. SCMR; 2015; Nice, Fr.: JCMR.
Baron CA, et al, The effect of concomitant gradient fields on diffusion tensor imaging. Magn Reson Med. 2012; 68(4):1190-201.
Bruegel M, et al., Characterization of focal liver lesions by ADC measurements using a respiratory triggered diffusion-weighted single-shot echo-planar MR imaging technique. Eur Radial. Mar. 2008;18(3):477-85.
Chen X, et al., Liver diffusion- weighted MR imaging: reproducibility comparison of ADC measurements obtained with multiple breath-hold, free-breathing, respiratory-triggered, and navigator-triggered techniques. Radiology. 2014;271(1):113-25.
Demir OI, et al, Contribution of diffusion-weighted MRI to the differential diagnosis of hepatic masses. Diagn Interv Radial, Jun. 2007;13(2):81-6.
Dou, J, et al. "Cardiac diffusion MRI without motion effects." Magnetic Resonance in Medicine: An Official Journal of the International Society for Magnetic Resonance in Medicine 48.1 (2002): 105-114.
Dubois, Jessica, et al. "Optimized diffusion gradient orientation schemes for corrupted clinical DTI data sets." Magnetic Resonance Materials in Physics, Biology and Medicine 19.3 (2006): 134-143.
Edelman RR, et al., In vivo measurement of water diffusion in the human heart. Magn Reson Med.1994;32(3):423-8.
Feinberg DA, et al, Inner volume MR imaging: technical concepts and their application. Radiology. 1985; 156(3):743-7.

Freidlin RZ, et al, A spin echo sequence with a single-sided bipolar diffusion gradient pulse to obtain snapshot diffusion weighted images in moving media. J Magn Reson. 2012; 221:24-31.
Gahm JK, et al, The effects of noise over the complete space of diffusion tensor shape. Med Image Anal. 2014; 18(1):197-210.
Gamper U, et al, Diffusion imaging of the in vivo heart using spin echoes-considerations on bulk motion sensitivity. Magn Reson Med. 2007;57(2):331-7.
Simonetti, O. P., et al. "An optimal design method for magnetic resonance imaging gradient waveforms." IEEE transactions on medical imaging 12.2 (1993): 350-360.
Gourtsoyianni S, et al, Respiratory gated diffusion-weighted imaging of the liver: value of apparent diffusion coefficient measurements in the differentiation between most commonly encountered benign and malignant focal liver lesions. Eur Radial. 2008;18(3):486-92.
Griswold MA, et al., Generalized autocalibrating partially parallel acquisitions (GRAPPA). Magn Reson Med. 2002; 47(6):1202-10.
Hargreaves BA, et al, Time-optimal multidimensional gradient waveform design for rapid imaging. Magn Reson Med. 2004;51(1):81-92.
Holm S, A simple sequentially rejective multiple test procedure, Scandinavi Fan journal of statistics. 1979:65-70.
International Searching Authority of the Patent Cooperation Treaty, International Search Report and Written Opinion for related Application No. PCT/US2017/014800, dated Apr. 19, 2017, 11 pages.
King KF, et al, Concomitant gradient field effects in spiral scans, Magn Reson Med. 1999; 41(1):103-12.
Kwee TC, et al, Comparison and reproducibility of ADC measurements in breathhold, respiratory triggered, and free-breathing diffusion-weighted MR imaging of the liver. J Magn Reson Imaging. 2008;28(5): 1141-8.
Kwee TC, et al, Diffusion-weighted whole-body imaging with background body signal suppression (DWIBS): features and potential applications in oncology. Eur Radial.,2008;18(9):1937-52.
Kwee TC, et al, Influence of cardiac motion on diffusion-weighted magnetic resonance imaging of the liver. Magma. 2009;22(5):319-25.
Lauenstein TC, et al, Evaluation of optimized inversion-recovery fat-suppression techniques for T2-weighted abdominal MR imaging. J Magn Reson Imaging. 2008; 27(6): 1448-54.
Lofberg J, Automatic robust convex programming. Optimization Methods & Software. 2012; 27(1):115-29.
Meier C, et al, Concomitant field terms for asymmetric gradient coils: consequences for diffusion, flow, and echo-planar imaging. Magn Reson Med. 2008; 60(1):128-34.
Middione MJ, et al, Convex gradient optimization for increased spatiotemporal resolution and improved accuracy in phase contrast MRI. Magn Reson Med. 2014;72(6):1552-64.
Murtz P, et al, Abdomen: diffusion-weighted MR imaging with pulse-triggered single-shot sequences. Radiology. 2002;224(1):258-64.
Naganawa S, et al., Diffusion-weighted imaging of the liver: technical challenges and prospects for the future. Magn Reson Med Sci. Dec. 31, 2005;4(4):175-86, NCBI, Bethesda, U.S.
Nguyen C, et al., In vivo three-dimensional high resolution cardiac diffusion-weighted MRI: A motion compensated diffusion-prepared balanced steady-state free precession approach. Magn Reson Med. 2013; 72(5): 1257-67.
Norris DG, Implications of bulk motion for diffusion-weighted imaging experiments: effects, mechanisms, and solutions. J Magn Reson Imaging, 2001;13(4):486-95.
Ozaki M, et al., Motion artifact reduction of diffusion-weighted MRI of the liver: use of velocity-compensated diffusion gradients combined with tetrahedral gradients. J Magn Reson Imaging. 2013;37(1):172-8.
Pai VM, et al, PCATMIP: enhancing signal intensity in diffusion-weighted magnetic resonance imaging. Magn Reson Med. 2011;65(6):1611-9.
Pop M, et al., Quantification of fibrosis in infarcted swine hearts by ex vivo late gadolinium-enhancement and diffusion-weighted MRI methods. Phys Med Biol. Aug. 7, 2013;58(15):5009-28, NCBI, Bethesda, U.S.

(56) References Cited

OTHER PUBLICATIONS

Potet J, et al., Detection of myocardial edema with low-b-value diffusion-weighted echo-planar imaging sequence in patients with acute myocarditis, Radiology, Nov. 1, 2013;269(2):362-9, RSNA, Oak Brook, U.S.

Rapacchi S, et al., Low b-value diffusion-weighted cardiac magnetic resonance imaging: initial results in humans using an optimal time-window imaging approach. Invest Radial. 2011;46(12):751-8.

Reese, Timothy G., et al. "Reduction of eddy-current-induced distortion in diffusion MRI using a twice-refocused spin acho." Magnetic Resonance in Medicine: An Official Journal of the International Society for Magnetic Resonance in Medicine 49.1 (2003): 177-182.

Sarnak, M. J. "Kidney disease as a risk factor for development of cardiovascular disease: a statement from the American Heart Association Councils on Kidney in cardiovascular disease, high blood pressure research, clinical cardiology, and epidemiology and prevention." Hypertension 42 (2003): 1050-1065.

Schulte RF, et al, Peripheral nerve stimulation-optimal gradient waveform design. Magn Reson Med. 2015; 74(2):518-22.

Sica CT, et al, Concomitant gradient field effects in balanced steady-state free precession, Magn Reson Med. 2007; 57(4):721-30.

Stoeck CT, et al, Second-order motion-compensated spin echo diffusion tensor imaging of the human heart. Magn Reson Med. 2015.

Storey P, et al., Partial k-space reconstruction in single-shot diffusion-weighted echo-planar imaging. Magn Reson Med. 2007; 57(3):614-9.

Saran, R. et al., US Renal Data System 2014 Annual Data Report: Epidemiology of Kidney Disease in the United States, American Journal of Kidney Diseases , vol. 66 , Issue 1 , A7.

Wedeen VJ, et al, Mapping complex tissue architecture with diffusion spectrum magnetic resonance imaging. Magn Reson Med. 2005; 54(6):1377-86.

Wedeen VJ, et al, Mri Signal Void Due to Inplane Motion is All-or-None. Magnetic Resonance in Medicine. 1994; 32(1):116-20.

Welsh C, et al, Higher-Order Motion-Compensation for in Vivo Cardiac Diffusion Tensor Imaging in Rats. IEEE Trans Med Imaging. 2015.

Wu MT, et al., Sequential changes of myocardial microstructure in patients postmyocardial infarction by diffusion-tensor cardiac MR: correlation with left ventricular structure and function. Circ Cardiovasc Imaging, Jan. 1, 2009, p. 32-40, vol. 2 (1), AHA/ASA Journals, Dallas, U.S.

Yeh FC, et al, Generalized q-sampling imaging, IEEE Trans Med Imaging. 2010; 29(9):1626-35.

Zhou XJ, et al, Artifacts induced by concomitant magnetic field in fast spin-echo imaging. Magn Reson Med. 1998; 40(4):582-91.

Zhou XJ, et al, Concomitant magnetic-field-induced artifacts in axial echo planar imaging. Magn Reson Med. 1998; 39(4):596-605.

\* cited by examiner

SYSTEM AND METHOD FOR OPTIMIZED DIFFUSION-WEIGHTED IMAGING

CROSS-REFERENCE TO RELATED APPLICATIONS

This application represents the national stage entry of International Application PCT/US2017/014800 filed Jan. 25, 2017, which claims benefit of U.S. Provisional Application 62/286,483 filed Jan. 25, 2016, all of which are hereby incorporated by reference as set forth in their entirety herein.

BACKGROUND

The present disclosure relates generally to systems and methods for medical imaging and, in particular, to systems and methods for diffusion-weighted imaging ("DWI").

Any nucleus that possesses a magnetic moment attempts to align itself with the direction of the magnetic field in which it is located. In doing so, however, the nucleus precesses around this direction at a characteristic angular frequency (Larmor frequency), which is dependent on the strength of the magnetic field and on the properties of the specific nuclear species (the gyromagnetic ratio $\gamma$ of the nucleus). Nuclei which exhibit these phenomena are referred to herein as "spins."

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment Mz is produced in the direction of the polarizing field, but the randomly oriented magnetic components in the perpendicular, or transverse, plane (x-y plane) cancel one another. If, however, the substance, or tissue, is subjected to a transient radiofrequency electromagnetic pulse (excitation field $B_1$) which is in the x-y plane and which is near the Larmor frequency, the net aligned moment, Mz, may be rotated, or "tipped", into the x-y plane to produce a net transverse magnetic moment Mt, which is rotating, or spinning, in the x-y plane at the Larmor frequency. The practical value of this phenomenon resides on signals that are emitted by the excited spins after the pulsed excitation signal $B_1$ is terminated. Depending upon chemically and biologically determined variable parameters such as proton density, longitudinal relaxation time ("T1") describing the recovery of Mz along the polarizing field, and transverse relaxation time ("T2") describing the decay of Mt in the x-y plane, this nuclear magnetic resonance ("NMR") phenomena is exploited to obtain image contrast and concentrations of chemical entities or metabolites using different measurement sequences and by changing imaging parameters.

When utilizing NMR to produce images and chemical spectra, a technique is employed to obtain NMR signals from specific locations in the subject. Typically, the region to be imaged (region of interest) is scanned using a sequence of NMR measurement cycles that vary according to the particular localization method being used. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified from the Larmor frequencies typical of the local field. The acquisition of the NMR signals is referred to as sampling k-space, and a scan is completed when sufficient NMR cycles are performed to fully or partially sample k-space. The resulting set of received NMR signals are digitized and processed to reconstruct the image using various reconstruction techniques.

To generate an MR anatomic image, gradient pulses are typically applied along the x, y and z-axis directions to localize the spins along the three spatial dimensions, and MR signals are acquired in the presence of one or more readout gradient pulses. An image depicting the spatial distribution of a particular nucleus in a region of interest of the object is then generated, using known post-processing techniques. Typically, the hydrogen nucleus (1H) is imaged, though other MR-detectable nuclei may also be used to generate images.

Diffusion-weighted imaging ("DWI") is an important MM technique that is based on the measurement of random motion of water molecules in tissues and provides directionally dependent microstructural information across a wide range of spatial scales. DWI has been utilized for studying the anatomy of the brain, including neural architecture and brain connectivity, as well as various brain disorders, including Alzheimer's disease, schizophrenia, mild traumatic brain injury, and so forth. In particular, DWI has been widely used to estimate the apparent diffusion coefficient ("ADC") in the brain, and is considered the clinical gold standard for detection of acute and chronic stroke. DWI has also demonstrated clinical value in the heart and liver, but sensitivity to macroscopic motion (especially cardiac and respiratory bulk motion) frequently contributes to large signal losses that confound measurements in these regions when using conventional methods.

Although some techniques have been developed to try to address macroscopic motion, these are not without shortcomings. For instance, synchronizing the DWI acquisition with physiologic motion has been one approach attempting to mitigate motion artifacts. Particularly in the liver, bulk motion artifacts can be partly reduced by implementing cardiac and respiratory triggering. However, this comes at a significant cost of increased acquisition time. In addition, triggering and respiratory motion compensation (via triggering, breath holds, or navigators) are insufficient to suppress bulk motion artifacts in the heart.

Therefore, there is a need for improved imaging systems and methods sensitive to diffusion that can be performed quickly and are insensitive to macroscopic motion artifacts.

SUMMARY

The present disclosure overcomes the drawbacks of previous technologies by providing a system and method directed to diffusion-weighted imaging ("DWI"). In particular, an optimization framework is introduced herein that can generate diffusion encoding gradient waveforms for acquiring diffusion-weighted images while simultaneously satisfying various constraints and optimizing various desired objectives. As will be apparent from description herein, the present approach takes into account imaging and hardware constraints, and allows for bulk (macroscopic) motion compensation while minimizing temporal footprint. In this manner, diffusion-weighted images with enhanced signal-to-noise ratios ("SNR") can be produced, and with increased bulk motion robustness in organs such as the heart, liver, and elsewhere.

In accordance with one aspect of the disclosure, a method for generating images using a magnetic resonance imaging ("MRI") is provided. The method includes providing a plurality of constraints for imaging a target at a selected diffusion weighting, and applying an optimization framework to generate an optimized diffusion encoding gradient waveform satisfying the plurality of constraints. The method also includes performing, using the MRI system, a pulse sequence comprising the optimized diffusion encoding gradient waveform to generate diffusion-weighted data, and generating at least one image of the target using the diffusion-weighted data.

In accordance with another aspect of the disclosure, a magnetic resonance imaging ("MRI") system is provided. The system includes a magnet system configured to generate a polarizing magnetic field about at least a region of interest ("ROI") of a subject arranged in the MRI system, a plurality of gradient coils configured to apply a gradient field with respect to the polarizing magnetic field, and a radio frequency ("RF") system configured to apply RF excitation fields to the subject and acquire MR image data therefrom. The system also includes a computer programmed to receive an indication of a plurality of constraints for imaging the ROI at a selected diffusion weighting, and apply a convex optimization framework to generate an optimized diffusion encoding gradient waveform satisfying the plurality of constraints. The computer is also programmed to direct the plurality of gradient coils and RF system to perform a pulse sequence comprising the optimized diffusion encoding gradient waveform to generate diffusion-weighted data, and generate at least one image of the target using the diffusion-weighted data.

The foregoing and other advantages of the invention will appear from the following description.

BRIEF DESCRIPTION OF THE DRAWINGS

The present invention will hereafter be described with reference to the accompanying drawings, wherein like reference numerals denote like elements.

DETAILED DESCRIPTION

Diffusion-weighted imaging, among other magnetic resonance imaging ("MRI") techniques, can provide invaluable information about the structure and function of various tissues in the body. In a diffusion-weighted pulse sequence, a pair of diffusion encoding gradients, or gradient waveforms, are typically applied along a direction to attenuate the transversal magnetization in a volume of tissue. The detected signal intensity depends on the diffusion of water. The "b-value" of a diffusion-weighted pulse sequence (measured in units of $s/mm^2$) indicates the degree of diffusion-weighting in an acquired image and dictates the level of signal attenuation as a function of tissue diffusivity. The b-value is determined in general by the strength and duration of the applied gradients and in some cases by the time interval between applied gradients. Higher b-values increase the effect of diffusion on the signal and decrease the overall signal intensity. Many anatomical regions, such as the heart, liver, and elsewhere, undergo large displacements due to cardiac and respiratory activity, and thus can introduce appreciable bulk motion-induced artifacts. Hence, DWI is most often used for imaging the brain.

Figure 1A:
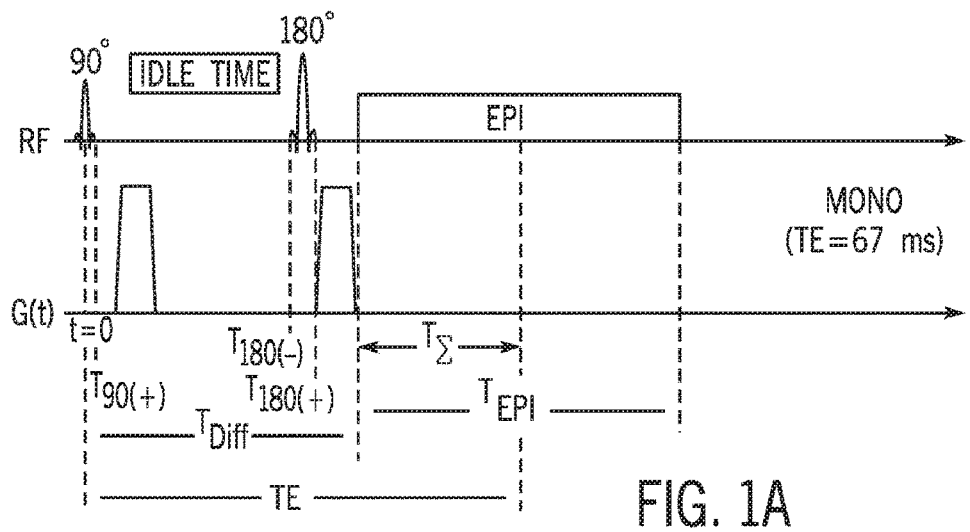
FIG. 1A is a schematic diagram illustrating an example monopolar ("MONO") diffusion-weighted pulse sequence.

Traditionally, diffusion-weighted imaging ("DWI") uses a Spin-Echo Echo Planar Imaging ("SE-EPI") pulse sequence with large, motion sensitizing, monopolar diffusion encoding gradients. FIG. 1A shows an example monopolar encoding SE-EPI sequence that is widely available and very fast. Although it produces moderate signal-to-noise ratios ("SNR") and spatial resolution, the sequence in FIG. 1A is very sensitive to bulk motion, and includes a dead time, or idle period, that extends the overall diffusion encoding temporal footprint. Hence, any bulk motion that occurs during diffusion encoding leads to substantial signal losses and elevated apparent diffusion coefficient ("ADC") values, which measure the magnitude of diffusion of water molecules in tissue.

Since bulk motion artifacts, and particularly artifacts from diffusion encoding, often cannot be corrected retrospectively, they must be addressed prospectively with careful modification to the DWI sequence. In some approaches, bulk motion sensitivity is reduced by shortening the temporal footprint of the diffusion encoding gradients, as in a stimulated echo acquisition mode ("STEAM"). In other approaches, bulk motion sensitivity is reduced by using motion compensated ("MOCO") diffusion encoding gradient waveforms that have nulled first order (M1) and/or second-order (M2) gradient moments.

Figure 1B:
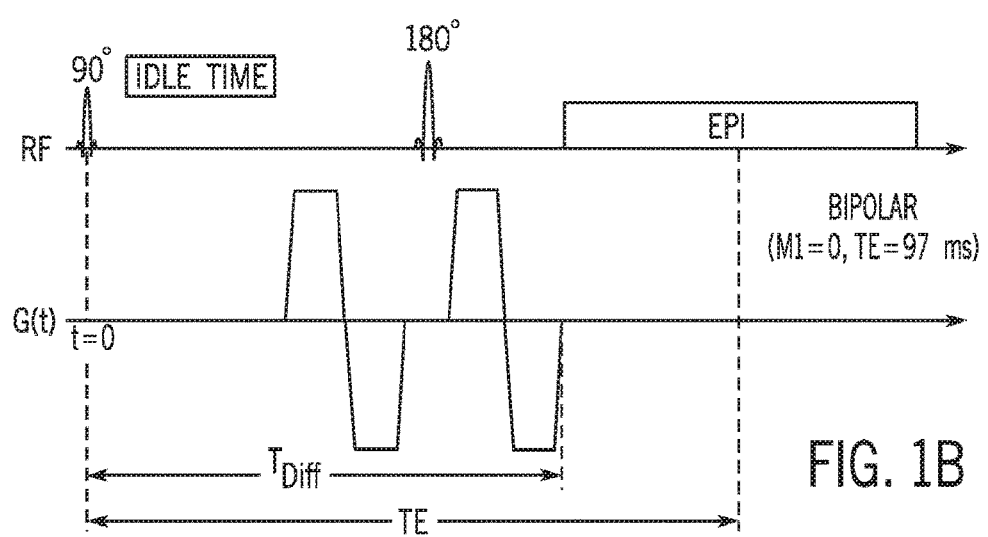
FIG. 1B is a schematic diagram illustrating an example bipolar diffusion-weighted pulse sequence.
Figure 1C:
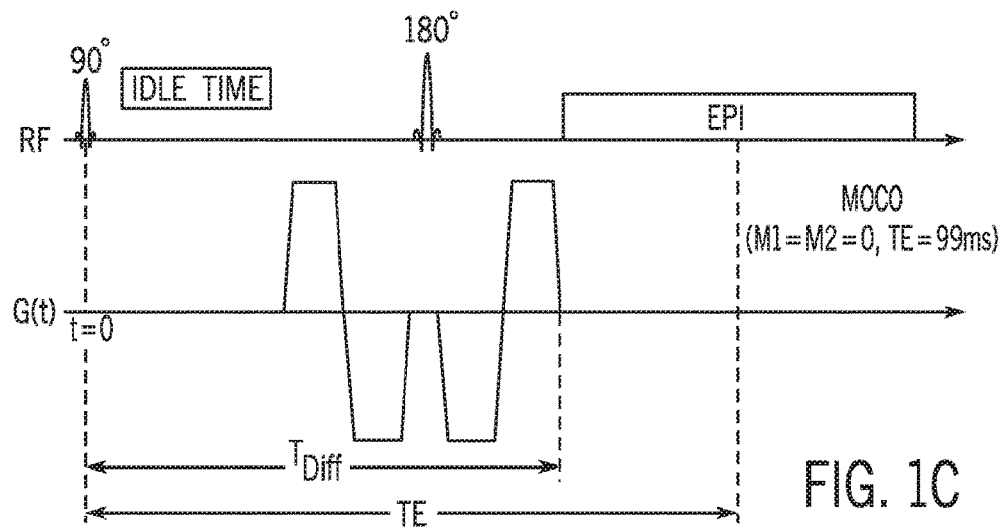
FIG. 1C is a schematic diagram illustrating an example motion compensated ("MOCO") diffusion-weighted pulse sequence.

Conventional MOCO diffusion encoding is typically accomplished using a multi-polar gradient waveform that necessarily and significantly increases the echo time ("TE") compared to monopolar encoding, degrading the SNR even in the absence of bulk motion. For example, FIG. 1B shows a bipolar SE-EPI pulse sequence where M1 is compensated, which requires a long diffusion encoding preparation. Velocity compensated diffusion encoding gradient waveforms (M1=0) have been implemented in the liver, resulting in improved ADC measurement reproducibility without respiratory or cardiac triggering, but with reduced SBR due to the extended TE. Similarly, FIG. 1C shows a MOCO SE-EPI pulse sequence where M1 and M2 are compensated. Such velocity and acceleration compensated waveforms (M1=M2=0) have been shown to improve the bulk motion robustness of cardiac DWI, yet also require a long diffusion encoding preparation, which imparts increased sensitivity to bulk motion over a longer temporal footprint and extends TE, thereby decreasing SNR. However, as appreciated from FIGS. 1A-1C, the TE of a SE-EPI pulse sequence is dictated by the temporal footprint of the diffusion encoding gradients, and duration of the EPI readout from start to the TE. There is a dead time between the radiofrequency ("RF") excitation and refocusing pulses, as shown in FIGS. 1A, 1B and 1C. This adds significant delays that can increase with longer EPI readouts for higher spatial resolution, lower bandwidth, and so forth.

In designing a diffusion-weighted pulse sequence, it is recognized herein that a number of imaging and hardware constraints are to be considered. For instance, diffusion encoding gradients need to be off during application of RF pulses and readout. In addition, diffusion encoding gradient waveforms need also conform to target b-values, gradient moment values, as well as hardware capabilities of the imaging system, such as maximum gradient amplitude and slew rate. However, obtaining closed-form gradient waveforms in a diffusion-weighted pulse sequence that can satisfy most or all imaging and hardware constraints and are time-optimal can be tremendously difficult, if not impossible. Hence, prior approaches have typically utilized general guidelines to develop pulse sequences (such as using trapezoidal diffusion gradients, and symmetrical arrangements), that often come at the expense of imaging speed or quality, as described.

To address this technological limitation, a novel optimization framework is herein introduced. This framework can be used to produce enhanced diffusion-weighted images by generating optimized diffusion encoding gradient waveforms that satisfy a number constraints and optimize a number of objectives, without need for restricting gradient waveform shape. In this manner, sensitivity to bulk motion artifacts may be mitigated and dead time eliminated, allowing difficult tissues or organs, such as the heart or liver, to be effectively imaged using diffusion-weighting. In some aspects, the optimization framework may include a convex optimized diffusion encoding ("CODE"), as will be described. However, it may be readily appreciated by one of ordinary skill in the art that the optimization framework could include a non-convex optimization, as well as other optimization approaches.

For instance, as will be described, the present approach can significantly shorten TE in a SE-EPI pulse sequence, and improve signal-to-noise ratios ("SNR"). It addition, it is recognized herein that the dead time between the RF excitation and refocusing pulses can be effectively utilized to decrease TE such that less diffusion encoding time is needed after the refocusing pulse. In particular, in some aspects, optimized diffusion encoding gradient waveforms generated using the herein provided system and method may be asymmetric about the refocusing pulse. Although discussion provided herein refers to SE-EPI pulse sequence, one of ordinary skill in the art would recognize that present approach is applicable more broadly to other diffusion-weighted pulse sequences.

As described, the present convex optimization framework can be used to generate optimized diffusion encoding gradients that satisfy a number of constraints, including gradient constraints, gradient moment constraints, and hardware constraints. In particular, gradient constraints include diffusion encoding gradient magnitude and timing, such as gradients being off during RF activity and during the data acquisition. With particular reference to the SE-EPI pulse sequence of FIG. 1A, for example, diffusion encoding gradients are zero during both RF excitation pulses and RF refocusing pulses, as well as EPI readout. In mathematical form, this may be expressed:

$$G(0 \leq t \leq T_{90(+)}) = 0 \qquad \text{Eqn. (1A)}$$

$$G(T_{180(-)} \leq t \leq T_{180(+)}) = 0 \qquad (1B)$$

$$G(T_{Diff} \leq t \leq TE) = 0 \qquad (1C)$$

where diffusion encoding begins at $t=T_{90(+)}$ (referring to the time immediately after 90° RF excitation pulse and EPI correction lines), the 180° RF refocusing pulse is played out when $T_{180(-)} \leq t \leq T_{180(+)}$, and the EPI readout occurs when $T_{Diff} \leq t \leq T_{Diff} + T_{EPI}$ (where $T_{EPI}$ is the EPI readout duration). The duration of the EPI readout gradient needed to reach the center k-space line is given by the echo time, TE, where $TE = 0.5*T_{EPI}$ for full-Fourier imaging, for example.

In some aspects, optimized diffusion encoding gradient waveforms may also satisfy gradient moment constraints, as described. This includes having M0 nulled at the end of diffusion encoding ($t=T_{Diff}$ in FIG. 1A), and, as required, having nulled M1, or M1 and M2. These gradient moment constraints may be expressed as:

$$M_0 = \int_0^{TDiff} G(t)dt = 0 \qquad \text{Eqn. (2A)}$$

$$M_1 = \int_0^{TDiff} tG(t)dt = 0 \qquad (2B)$$

$$M_2 = \int_0^{TDiff} t^2 G(t)dt = 0 \qquad (2C)$$

The imaging gradients played during the EPI readout have zero net M0, and negligible M1, and M2 at the TE (<1% of typical moments from MONO). Therefore if they are nulled at $t=T_{Diff}$, they would also effectively nulled at $t=TE$. The moments of the slice select gradient, which may also be negligible (<0.5% of typical diffusion encoding gradient moments for MONO) with respect to the diffusion encoding gradients, were not, but could be, considered in this optimization. Although Eqns. 2 indicate gradient moment constraints for M0, M1 and M2, it is envisioned that the present approach may be readily extended to any combination of gradient moment constraints, including higher order gradient moments, such as M3, M4, and so forth.

From a practical standpoint, designed gradient waveforms must also adhere to gradient hardware limitations, or hardware constraints, including maximum gradient amplitude ("$G_{max}$") and slewrate ("$SR_{max}$"). This leads to the following terms:

$$G(t) \leq G_{max} \qquad \text{Eqn. (3A)}$$

$$\dot{G}(t) \leq SR_{max} \qquad (3B)$$

As described, the magnitude of diffusion-weighting in a DWI acquisition is characterized by the b-value, which is given by:

$$b = \gamma^2 \int_0^{TDiff} F(t)^2 dt \qquad \text{Eqn. (4)}$$

where $$F(t) = \int_0^t G(\tau) d\tau \qquad \text{Eqn. (5)}$$

In Eqn. 5, G(t) is the gradient amplitude as a function of time, $T_{Diff}$ is the time at the end of the diffusion encoding gradient waveform, and γ is the gyromagnetic ratio of 1H. The time t=0 corresponds with the center of the RF excitation pulse.

Figure 2:
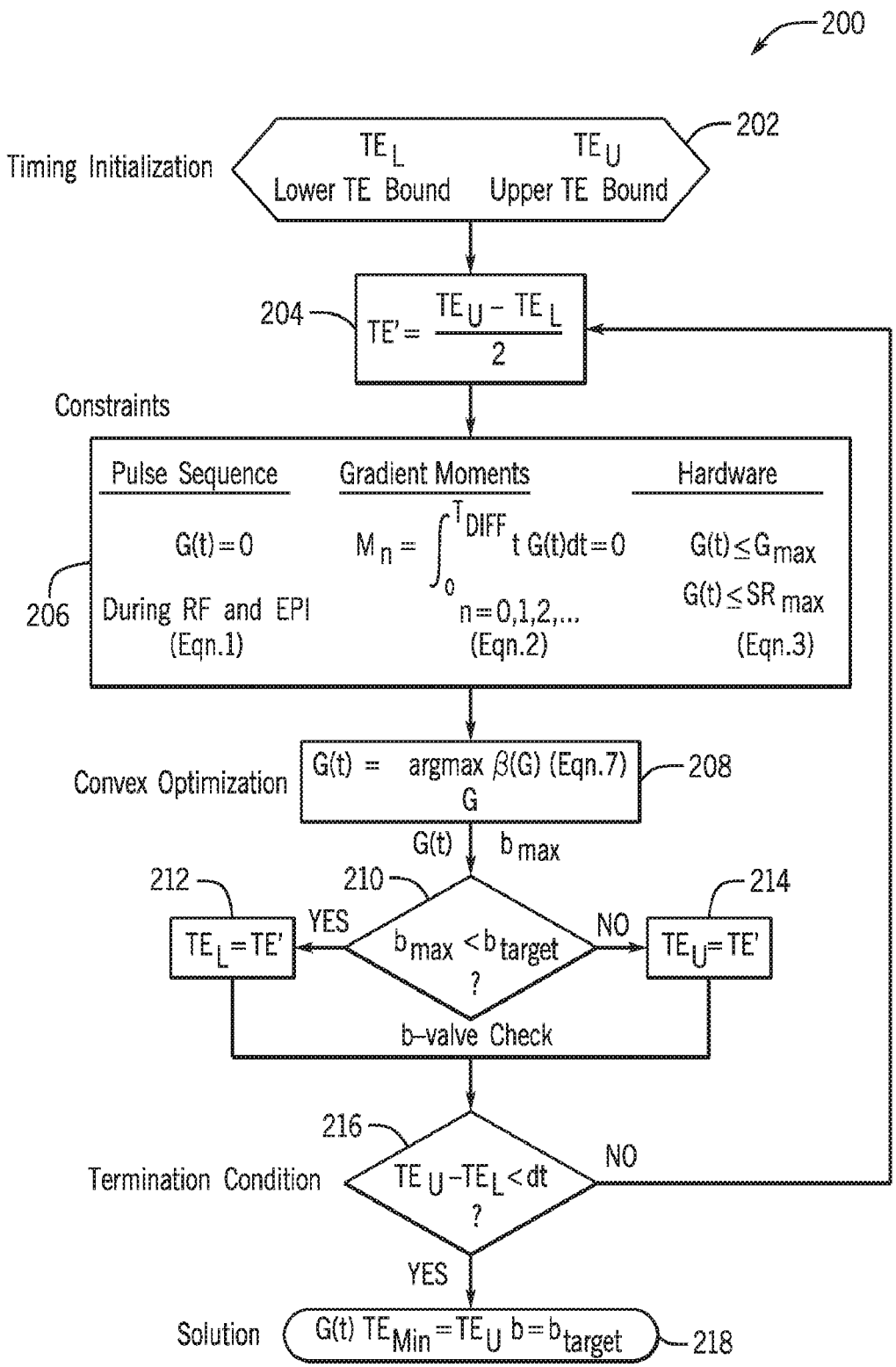
FIG. 2 is a flowchart setting forth steps of a process, in accordance with aspects of the present disclosure.

Referring now to FIG. 2, a flowchart illustrating steps of a process 200 for generating optimized diffusion encoding gradient waveforms, in accordance with aspects of a method of the present disclosure, is shown. Although process 200 shows specific steps and implementations, indeed various modifications would be apparent to one of ordinary skill in the art, and such modifications may still be considered within the scope of the present approach.

The process 200 may begin with a timing initialization, as indicated by process block 202, which establishes initial values for lower and upper TE bounds, $TE_L$ and $TE_U$, respectively. Such values may be selected in accordance with desired diffusion-weighted images and pulse sequence utilized. A target b-value, $b_{target}$, may also be provided at this step. In some aspects, $TE_U$ may be defined by the TE of the non-optimized sequence with the desired gradient moments (i.e., monopolar for M0=0, bipolar for M0=M1=0, modified bipolar for M0=M1=M2=0) (FIGS. 1A-1C, for example). Also, $TE_L$ may be defined by the TE of an equivalent spin echo sequence (i.e., without diffusion encoding gradients), which has a minimum TE of $2 \cdot (0.5 \cdot T_{180} + T\epsilon$(FIG. 1A).

Following computation $TE' = (TE_L - TE_U)/2$, as indicated by process block 204, a number of constraints are provided at process block 206. As shown in FIG. 2, the constraints may include gradient constraints (Eqns. 1), gradient moment constraints (Eqns. 2), and hardware constraints (Eqns. 3). The combination of constraints may depend upon specific imaging requirements, such as requirements for controlling bulk motion, and hardware requirements.

Then, at process block 208, at least one objective functional is determined based on the provided constraints. In some aspects, the objective functional(s) may be configured to reflect other objectives, constraints, or terms, including Maxwell terms, simulation thresholds, noise/sound pressure, eddy currents, and others. Specifically, the b-value in Eqn. 4 is a convex functional of G(t) (i.e. its second variation is positive definite) and therefore does not necessarily have a single maximum. In addition, Eqn. 4 is not a unique functional of G(t), which means that multiple waveforms can produce the same b-value (e.g., +G(t) and −G(t) have the same b-value). Therefore, to facilitate optimization, the objective function can be reformulated by defining the function, β:

$$\beta = \int_0^{TDiff} F(t)dt \qquad \text{Eqn. (6)}$$

The magnitude of β corresponds directly with the b-value, but it is a concave functional of G(t) (i.e. its second variation is negative definite; therefore it contains a maximum that can be determined. Consequently, the gradient waveform G(t) that produces the maximum β (and thus the maximum b-value) can be determined using the following objective function:

$$G(t) = \underset{G}{\mathrm{argmax}} \beta(G) \quad \text{Eqn. (7)}$$

A convex optimization may then be carried out to generate a solution for optimized diffusion encoding gradient waveforms, where G(t) may be defined discretely on t=m·dt where dt is the temporal resolution of the optimization and m is an integer between 1 and $T_{Diff}$/dt.

The optimization begins by determining a maximum b-value, $b_{max}$, for a fixed TE', and then subsequently adjusting the TE' until the maximum is equivalent to $b_{target}$. As shown in FIG. 2, this includes evaluating the condition $b_{max} < b_{target}$ at decision block 210, and based whether true or not, setting $TE_L$=TE' or $TE_U$=TE', as indicated by process block 212 and 214 respectively. Then, at decision block 216, an evaluation is made for the termination condition $TE_U$−$TE_L$≤dt. If not satisfied, the process 200 continues with process block 204. Otherwise, a time optimal solution is reached at process block 218, having an optimized diffusion encoding gradient waveform G(t), that satisfies the target b-value and reaches a minimized TE. As appreciated from FIG. 2, the optimization problem can be efficiently solved through successive binary searches that divide the TE search space with each iteration of Eqn. 7. The optimized diffusion encoding gradient waveform may then be included in a pulse sequence that is executed, using an imaging system, to generate diffusion-weighted imaging.

Figure 3:
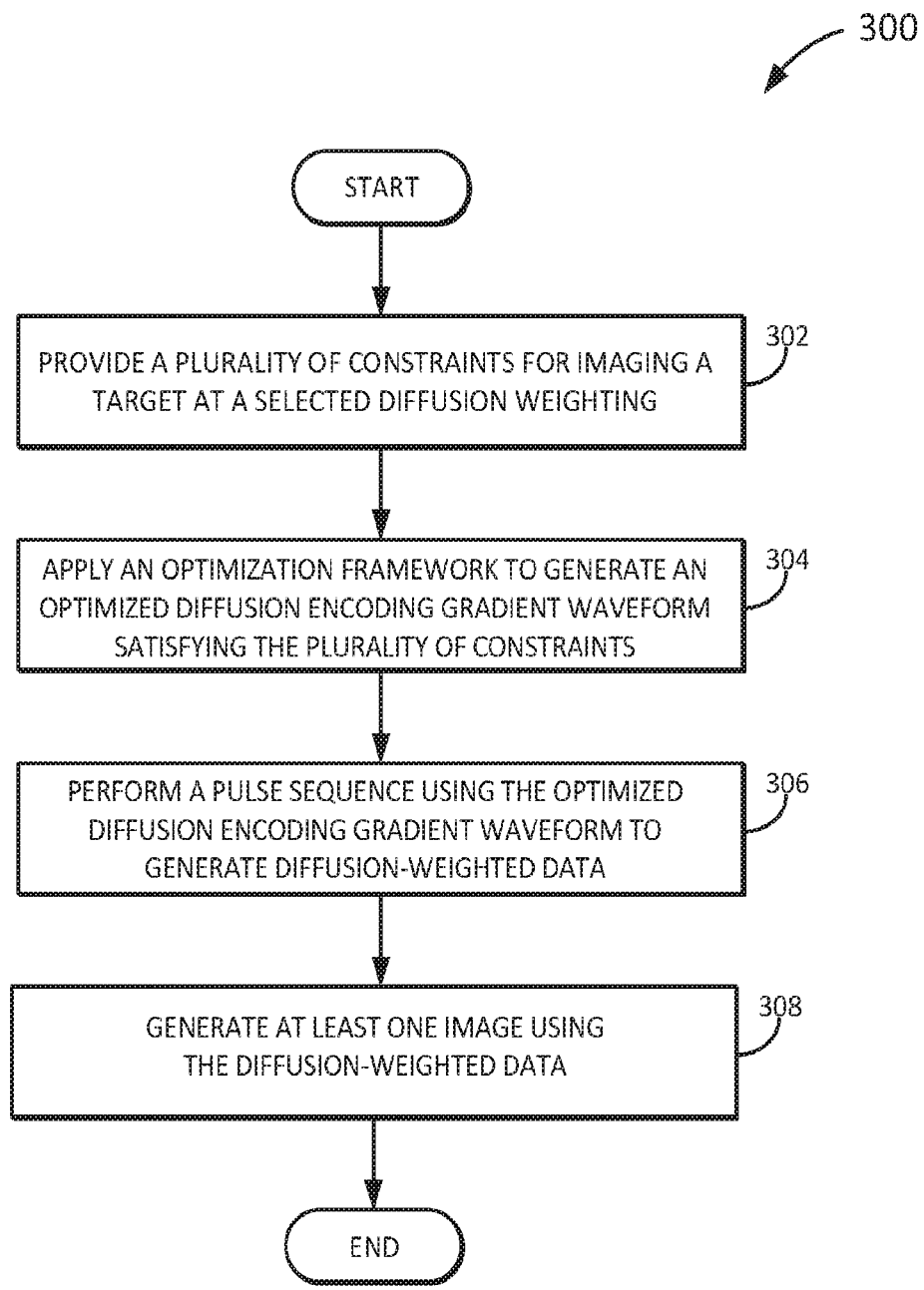
FIG. 3 is a flowchart setting forth steps of a process, in accordance with aspects of the present disclosure.

FIG. 3 is a flowchart setting forth steps of a process 300, in accordance with aspects of a method of the present disclosure. This process 300 may be carried out using a magnetic resonance imaging ("MRI") system, as will be described with reference to FIG. 4, or any suitable system. In some aspects, the process 300 may be embodied using software or instructions stored in non-transitory computer-readable media.

The process 300 may begin at process block 302 with providing a plurality of constraints for imaging a target at a selected diffusion weighting. As described, this may include providing gradient constraints, gradient moment constraints, and hardware constraints, as well as other objectives. In some aspects, an indication may also be provided at process block 302 with respect to the imaging pulse sequence being utilized. For example, the indication may include parameters associated with a SE-EPI pulse sequence, including desired field-of-view, spatial resolution, SNR, and so forth. In addition, the indication may include a selected b-value, or diffusion-weighting and applied gradient directions.

Then, at process block 304, an optimization framework, such as a convex optimization framework, may be applied to generate an optimized diffusion encoding gradient waveform. As described with reference to FIG. 2, this process includes generating an objective function based on the provided constraints, (Eqn. 7) and other objectives, and obtaining solution for the gradient waveform, based on the selected b-value, using an iterative process. As described, the iterative process may be performed to minimize pulse sequence timing parameters, such as TE, gradient duration during the diffusion encoding period(s), and other timings.

Figure 1D:
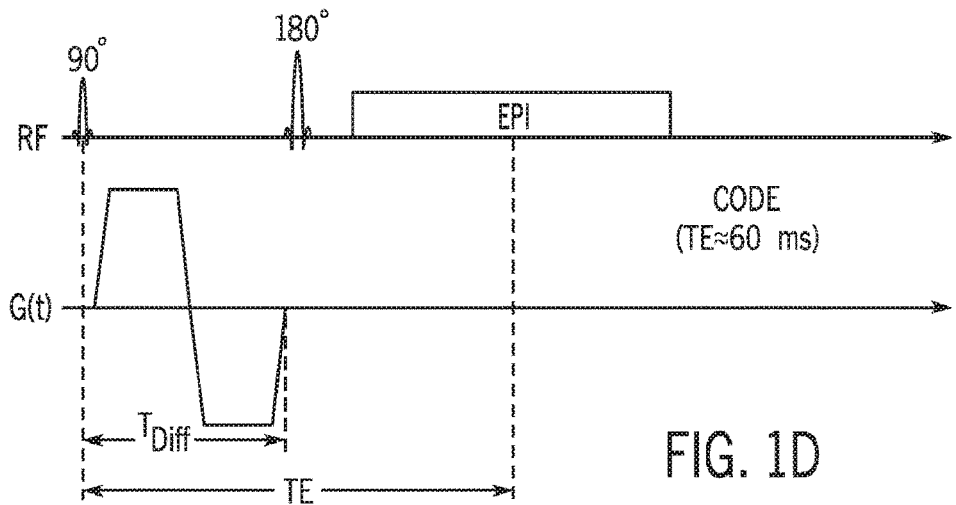
FIG. 1D is a schematic diagram illustrating an example diffusion-weighted pulse sequence based on a convex optimized diffusion encoding ("CODE"), in accordance with aspects of the present disclosure, corresponding to FIG. 1A.
Figure 1E:
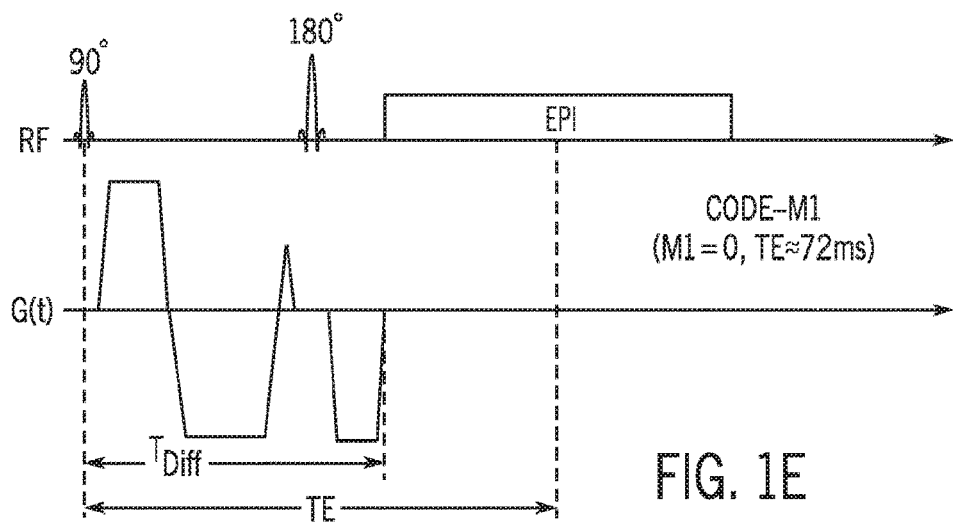
FIG. 1E is a schematic diagram illustrating another example diffusion-weighted pulse sequence corresponding to FIG. 1B based on CODE and having the first moment nulled ("CODE-$M_1$"), in accordance with aspects of the present disclosure.
Figure 1F:
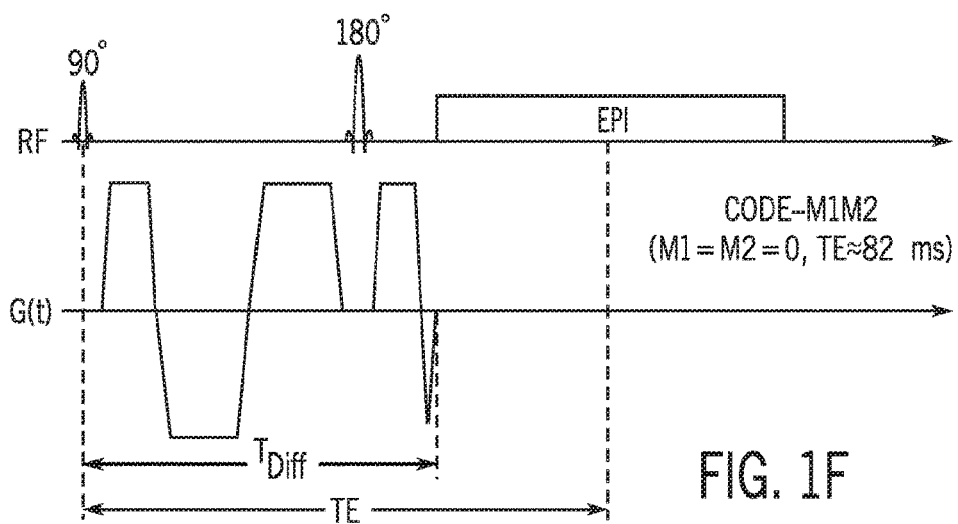
FIG. 1F is a schematic diagram illustrating yet another example diffusion-weighted pulse sequence corresponding to FIG. 1C based on CODE and having the first and second moments nulled ("CODE-$M_1M_2$"), in accordance with aspects of the present disclosure.

The optimized diffusion encoding gradient waveform may then be used in a pulse sequence to generate diffusion-weighted data, as indicated by process block 306. By way of example, FIGS. 1D-1F show non-limiting SE-EPI pulse sequences incorporating optimized diffusion encoding gradient waveforms in accordance with the present approach. As appreciated from the figures, various gradient waveforms (in dependence of the indicated constraints) may be played out between the RF excitation, refocusing pulses, and EPI data acquisition. In this manner, reduced TEs without dead time can be achieved for target b-values, in contrast to the previous techniques, shown in FIGS. 1A-1C. It may be appreciated that various pulse sequences, including various data acquisitions and k-space sampling trajectories may be utilized.

Referring again to FIG. 3, from the diffusion-weighted data obtained at process block 306, at least one image may be generated at process block 308 using various image reconstruction techniques and methods. Non-limiting examples of images generated at process block 308 include diffusion-weighted images, ADC maps, diffusion tensor images ("DTIs"), diffusion restriction images, and higher order q-space images. As such, it may be appreciated that any of the above steps may be repeated for a number of times, and for a number of gradient field directions, depending on the imaged structures, image type, and amount of diffusion-weighted data sufficient for desired SNR. In some aspects, gradient directions to be sampled are accounted for in the optimization.

Figure 4:
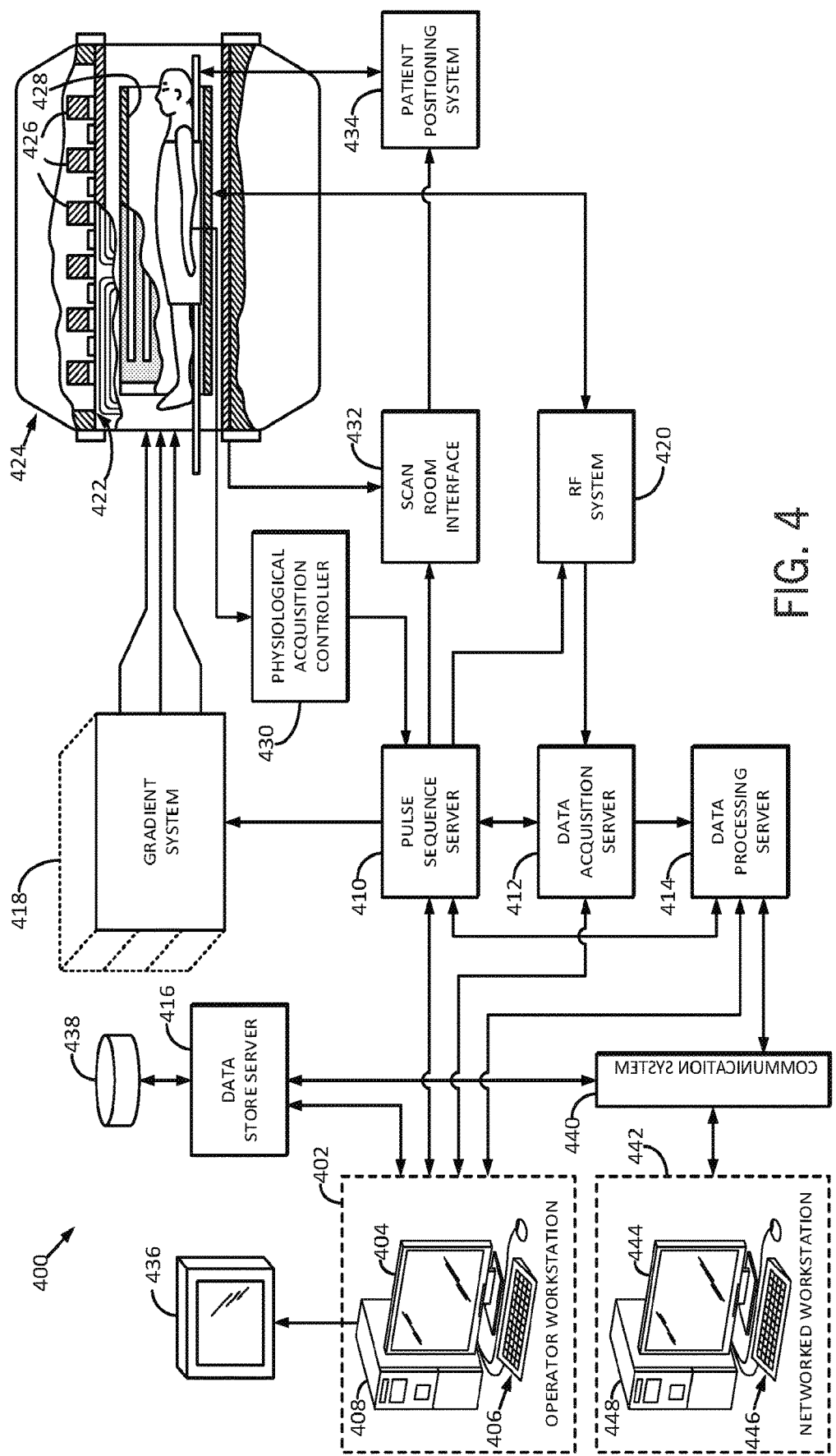
FIG. 4 is a schematic diagram of a magnetic resonance imaging system, in accordance with aspects of the present disclosure.

Referring now particularly to FIG. 4, an example of an MRI system 400, in accordance with aspects of the present disclosure, is illustrated. The MRI system 400 includes a workstation 402 having a display 404 and a keyboard 406. The workstation 402 includes a processor 408, such as a commercially available programmable machine running a commercially available operating system. The workstation 402 provides the operator interface that enables scan prescriptions to be entered into the MRI system 400. The workstation 402 is coupled to servers, including a pulse sequence server 410, a data acquisition server 412, a data processing server 414, and a data store server 416. The workstation 402 and each server 410, 412, 414, and 416 are in communication.

The pulse sequence server 410 functions in response to instructions downloaded from the workstation 402 to operate a gradient system 418 and a radiofrequency ("RF") system 420. Gradient waveforms necessary to perform the prescribed scan are produced and applied to the gradient system 418, which excites gradient coils in an assembly 422 to produce the magnetic field gradients $G_x$, $G_y$, and $G_z$ used for position encoding MR signals. The gradient coil assembly 422 forms part of a magnet assembly 424 that includes a polarizing magnet 426 and a whole-body RF coil 428.

RF excitation waveforms are applied to the RF coil 428, or a separate local coil (not shown in FIG. 4), by the RF system 420 to perform the prescribed magnetic resonance pulse sequence. Responsive MR signals detected by the RF coil 428, or a separate local coil, are received by the RF system 420, amplified, demodulated, filtered, and digitized under direction of commands produced by the pulse sequence server 410. The RF system 420 includes an RF transmitter for producing a wide variety of RF pulses used in MR pulse sequences. The RF transmitter is responsive to the scan prescription and direction from the pulse sequence server 410 to produce RF pulses of the desired frequency, phase, and pulse amplitude waveform. The generated RF pulses may be applied to the whole body RF coil 428 or to one or more local coils or coil arrays.

The RF system 420 also includes one or more RF receiver channels. Each RF receiver channel includes an RF preamplifier that amplifies the MR signal received by the coil 428 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2}$$ Eqn. (8);

and the phase of the received MR signal may also be determined:

$$\varphi = \tan^{-1}\left(\frac{Q}{I}\right).$$ Eqn. (9)

The pulse sequence server 410 also optionally receives patient data from a physiological acquisition controller 430. The controller 430 receives signals from a number of different sensors connected to the patient, such as electrocardiograph ("ECG") signals from electrodes, or respiratory signals from a bellows or other respiratory monitoring device. Such signals are typically used by the pulse sequence server 410 to synchronize, or "gate," the performance of the scan with the subject's heart beat or respiration.

The pulse sequence server 410 also connects to a scan room interface circuit 432 that receives signals from various sensors associated with the condition of the patient and the magnet system. It is also through the scan room interface circuit 432 that a patient positioning system 434 receives commands to move the patient to desired positions during the scan.

The digitized MR signal samples produced by the RF system 420 are received by the data acquisition server 412. The data acquisition server 412 operates in response to instructions downloaded from the workstation 402 to receive the real-time MR data and provide buffer storage, such that no data is lost by data overrun. In some scans, the data acquisition server 412 does little more than pass the acquired MR data to the data processor server 414. However, in scans that require information derived from acquired MR data to control the further performance of the scan, the data acquisition server 412 is programmed to produce such information and convey it to the pulse sequence server 410. For example, during prescans, MR data is acquired and used to calibrate the pulse sequence performed by the pulse sequence server 410. Also, navigator signals may be acquired during a scan and used to adjust the operating parameters of the RF system 420 or the gradient system 418, or to control the view order in which k-space is sampled. In all these examples, the data acquisition server 412 acquires MR data and processes it in real-time to produce information that is used to control the scan.

The data processing server 414 receives MR data from the data acquisition server 412 and processes it in accordance with instructions downloaded from the workstation 402. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion, flow, or diffusion-weighted images.

Images reconstructed by the data processing server 414 are conveyed back to the workstation 402 where they are stored. Real-time images are stored in a data base memory cache, from which they may be output to operator display 412 or a display 436 that is located near the magnet assembly 424 for use by attending physicians. Batch mode images or selected real time images are stored in a host database on disc storage 438. When such images have been reconstructed and transferred to storage, the data processing server 414 notifies the data store server 416 on the workstation 402.

The MRI system 400 may also include one or more networked workstations 442. By way of example, a networked workstation 442 may include a display 444, one or more input devices 446 (such as a keyboard and mouse or the like), and a processor 448. The networked workstation 442 may be located within the same facility as the operator workstation 402, or in a different facility, such as a different healthcare institution or clinic. The networked workstation 442 may include a mobile device, including phones or tablets.

The networked workstation 442, whether within the same facility or in a different facility as the operator workstation 402, may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may exchanged between the data processing server 414 or the data store server 416 and the networked workstations 442, such that the data or images may be remotely processed by a networked workstation 442. This data may be exchanged in any suitable format, such as in accordance with the transmission control protocol ("TCP"), the interne protocol ("IP"), or other known or suitable protocols.

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure (s) algorithm(s), step(s), operation(s), formula(e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, that the terms processor, computer processor, central processing unit ("CPU"), and computer are used synonymously to denote a device capable of executing the instructions and communicating with input/output interfaces and/or peripheral devices, and that the terms processor, computer processor, CPU, and computer are intended to encompass single or multiple devices, single core and multicore devices, and variations thereof.

The above-described system and method may be further understood by way of examples. These examples are offered for illustrative purposes only, and are not intended to limit the scope of the present invention in any way. Indeed, various modifications of the invention in addition to those shown and described herein will become apparent to those skilled in the art from the foregoing description and the following examples and fall within the scope of the appended claims.

EXAMPLE

The following example is non-limiting. Rather, it is but one example of systems and methods that have been and can be achieved in but one implementation of the above-described systems methods.

The present convex optimized diffusion encoding ("CODE") framework was evaluated for minimum echo time and bulk motion compensated diffusion-weighted imaging ("DWI"). In particular, diffusion encoding gradient waveforms were designed for a range of b-values and spatial resolutions with and without motion compensation using the CODE framework. CODE, first moment (M1) nulled CODE-M1, and first and second moment (M2) nulled CODE-M1M2 were used to acquire neuro, liver, and cardiac ADC maps in healthy subjects (N=10) that were compared respectively to monopolar (MONO), BIPOLAR (M1=0) and motion compensated (MOCO, M1+M2=0) diffusion encoding. Results show that CODE can significantly improve the SNR of neuro ADC maps compared with MONO (19.5±2.5 vs. 14.5±1.9). CODE-M1 liver ADCs were significantly lower (1.3±0.1 vs. 1.8±0.3×10-3 mm2/s, i.e. less motion corrupted) and more spatially uniform (6% vs. 55% ROI difference) than MONO and had higher SNR than BIPOLAR (SNR=14.9±5.3 vs. 8.0±3.1). CODE-M1M2 cardiac ADCs were significantly lower than MONO (1.9±0.6 vs. 3.8±0.3×10-3 mm2/s) throughout the cardiac cycle and had higher SNR than MOCO at systole (9.07±3.9 vs. 6.95±2.6) while reporting similar ADCs (1.49±0.2 vs. 1.36±0.6×10-3 mm$^2$/s). Hence, CODE can significantly improve SNR for ADC mapping in the brain, liver and heart; and significantly improved DWI bulk motion robustness in the liver and heart.

Example Methods

Diffusion Encoding Gradient Waveform Design

In order to evaluate the reduction in TE when using CODE, diffusion encoding gradient waveforms were designed for a range of b-values (100-1000 s/mm$^2$) and Tε (10-60 ms); corresponding to roughly 0.5-3.0 mm in plane resolution, with full Fourier symmetric k-space coverage) using the following designs: 1) monopolar (MONO, FIG. 1A); 2) CODE with M0=0 (CODE, FIG. 1D, 3) velocity compensated (M0=M1=0) bipolar (BIPOLAR, FIG. 1B); 4) velocity compensated (M0=M1=0) CODE (CODE-M1, FIG. 1E); 5) velocity and acceleration compensated (M0=M1=M2=0) modified bipolar (MOCO, FIG. 1C); 6) velocity and acceleration compensated CODE (CODE-M1M2, FIG. 1F).

All diffusion encoding gradient waveforms were designed for a 3T MRI scanner (Prisma, Siemens, Erlangen, Germany) with high performance gradients ($G_{max}$=80 mT/m and $SR_{max}$=200 T/m/s). To limit peripheral nerve stimulation during diffusion encoding, the gradient performance was limited to $G_{max}$=74 mT/m and $SR_{max}$=50 T/m/s. All optimizations were done in MATLAB (Mathworks, Natick, Mass., USA) using the CPLEX linear solver (IBM, Armonk, N.Y., USA) with the YALMIP toolbox and used time-step dt=100 μs to maintain reasonable computation times (<5 min). Shorter time-steps increase computational demand without significantly reducing echo times.

Concomitant Field Correction

The application of a gradient field leads to the production of concomitant magnetic fields as described by the higher order terms of Maxwell's equations. Because DWI typically employs large gradient amplitudes, these fields can have a notable effect and lead to erroneous DWI pixel values, distorted images, and consequently problematic ADC maps. Concomitant fields are not typically an issue in DWI because they are cancelled out when diffusion encoding gradient waveforms are identical on either side of a refocusing pulse. However, because the CODE gradient waveforms need not be symmetrical, or identical on either side of the refocusing pulse, the concomitant fields must be considered. Therefore, a prospective approach previously used in PC-MRI and DWI was implemented in the CODE sequence. Phase variations due to concomitant fields were linearly approximated on the scanner for the direction-specific diffusion encoding gradient waveform and were corrected by adding a gradient magnitude offset to the diffusion encoding gradient waveform along the x, y and z axes.

In-Vivo Protocols

DWI protocols were designed for neuro ($T_\varepsilon=27.1$ ms, $T_{90(+)}=5.8$ ms, $T_{180}=4.3$ ms), liver ($T_\varepsilon=26.4$ ms, $T_{90(+)}=5.3$ ms, $T_{180}=4.3$ ms) and cardiac ($T_\varepsilon=25.3$ ms, $T_{90(+)}=5.4$ ms, $T_{180}=4.3$ ms) acquisitions with and without CODE. The specific parameters are defined in Table 1. All acquisitions included diffusion encoding along three oblique orthogonal directions. In the cardiac protocols, FOV reduction was performed in the phase encode direction using phase cycling between the excitation and refocusing RF pulses.

Concomitant Field Evaluation

To evaluate the performance of the concomitant field correction strategy, DWI were acquired in a uniform water phantom along seven directions (x,y,z,xy,xz,yz,xyz) using MONO diffusion encoding as a reference for comparison to both CODE-M1M2 with and without the concomitant field correction (using the cardiac DWI protocols). Maps from single-direction projections of the ADC were reconstructed independently for each direction, in addition to a composite ADC map (from all directions).

TABLE 1

Imaging parameters used in the neuro, liver and cardiac protocols are shown. Interleaved multi-slice imaging was used in the liver protocols. Reduced FOV imaging was used in the cardiac protocols using phase cycling between the 90° and 180° pulses. Additional fat suppression was achieved in the cardiac protocols using spatially selective saturation bands.

|  | Neuro | | Liver | | | Cardiac | | |
| --- | --- | --- | --- | --- | --- | --- | --- | --- |
|  | MONO | CODE | MONO | BIPOLAR | CODE-$M_1$ | MONO | MOCO | CODE-$M_1M_2$ |
| TE [ms] | 75 | 64 | 67 | 97 | 72 | 65 | 93 | 76 |
| TR [ms] | 5000 ms | | 1000 ms | | | 1 Heartbeat | | |
| Resolution [mm] | 1.6 × 1.6 × 3.0 | | 2.0 × 2.0 × 7.0 | | | 1.5 × 1.5 × 5 | | |
| FOV [mm] | 220 × 220 | | 300 × 300 | | | 200 × 160 | | |
| BW [Hz/px] | 1450 | | 1740 | | | 2000 | | |
| b [s/mm²] | 0, 1000 | | 0, 500 | | | 0, 350 | | |
| Fat Suppression | None | | SPAIR | | | Water Excitation | | |
| Common | Parallel Imaging Acceleration (GRAPPA) Factor 2, Full-Fourier k-space sampling | | | | | | | |

Phantom Validation

All protocols were performed in a polyvinylpyrrolidone diffusion phantom (High Precision Devices, Boulder, Colo., USA) containing thirteen regions with varying diffusivities. The ADC was reconstructed for each protocol and the mean value was calculated within each of the thirteen regions. Mean ADCs obtained with the neuro (MONO and CODE with b=1000 mm²/s), liver (MONO and CODE-M1 with b=500 mm²/s) and cardiac protocols (MONO and CODE-M1M2 with b=350 mm²/s) were compared using linear regression analysis.

In Vivo Acquisitions

MRI examinations were performed on healthy volunteers who provided signed statements of informed consent prior to each MRI exam. All studies were in compliance with the local IRB, state, and federal guidelines. All imaging was performed on a 3T MRI scanner (Prisma, Siemens, Erlangen, Germany).

Neuro DWI

DWI of the brain were acquired in healthy volunteers (N=10) in a single axial slice with the neuro MONO and CODE protocols. All acquisitions included three discarded TRs to reach steady state and were repeated ten times for SNR analysis (scan time: 3 min 40 sec). ADC maps were reconstructed for each of the ten repetitions of MONO and CODE using linear least squares. A voxel-wise SNR map was generated by dividing the mean ADC at each voxel by the standard deviation (across the ten repetitions). The global mean SNR was then calculated within the brain for CODE and MONO and compared across the ten subjects.

Liver DWI

Breath held liver DWI were acquired in healthy volunteers (N=10) using the MONO, BIPOLAR and CODE-M1 liver protocols with three averages. Cardiac triggering was not used. Slice interleaved imaging was used to acquire four slices per TR and provide coverage of the superior and inferior liver in two breath holds (8 slices). Additional non-diffusion weighted (b=0) images were also acquired separately with four repetitions (three averages per repetition) for SNR analysis. All acquisitions included three discarded TRs to reach steady state (scan time: 15 s per breath hold).

ADC maps were reconstructed for MONO, BIPOLAR, and CODE-M1 acquisitions using linear least squares. Four regions of interest ("ROIs") were manually defined in homogeneous liver regions (free of vessels) in the lateral left lobe (LL), medial left lobe (ML), superior right lobe (SR) and inferior right lobe (IR). The mean ADC was calculated within each ROI for each acquisition. To identify motion corruption, the mean ADCs in the three superior ROIs (ADCLL, ADCML and ADCSR) were compared with that in IR (ADCIR, most inferior and least influenced by cardiac motion).

SNR maps were then calculated from the b=0 images for MONO, BIPOLAR and CODE-M1 (voxel-wise standard deviation divided by mean signal across repetitions). The mean SNR was calculated within the IR ROI and compared between MONO, BIPOLAR and CODE-M1 across the ten subjects.

Cardiac DWI

Cardiac MM examinations were performed in healthy volunteers (N=10). First, the timing of end systole (TSYS, the time-point with minimum ventricular volume) and early diastole (TDIA, the first time-point after rapid filling) were visually determined for each subject using high temporal resolution (20 ms) balanced steady state free precession (bSSFP) CINE imaging.

Breath held DWI images were then acquired using the MONO and CODE-M1M2 cardiac protocols. Both protocols were acquired with ECG triggering delayed to the following eight subject-specific cardiac phases: 0.5TSYS, 0.75TSYS, TSYS, TSYS+0.25(TDIA-TSYS), TSYS+0.5 (TDIA-TSYS), TDIA, TDIA+0.25(RR-TDIA), and TDIA+ 0.5(RR-TDIA), where RR is cardiac cycle duration. Each acquisition included three discarded TRs to reach steady state and three repetitions to improve SNR (scan time: 15 heartbeats or ~15 seconds).

ADC maps were reconstructed for each cardiac phase for both MONO and CODE-M1M2 using linear least squares. The masks were manually defined to isolate the LV myocardium at each cardiac phase based on the non-diffusion weighted images. The mean ADC was calculated within the LV for each phase and compared with the diffusivity of free water at 37° C. (3.0×10-3 mm2/s, a thermodynamic upper bound for soft tissue ADC) using a one-sided comparison. Motion corrupted measurements were identified by voxels in which the reported ADC exceed 3.0×10-3 mm$^2$/s. The percentage of LV voxels with motion corruption was calculated for MONO and CODE-M1M2 at each cardiac phase and compared across the ten volunteers.

An additional cohort of volunteers (N=10) was scanned using MONO, MOCO, and CODE-M1M2 at a single systolic phase (0.5TSYS) for SNR and ADC comparisons between methods. Two acquisitions were obtained for each technique in separate breath holds: 1) the cardiac ADC mapping protocol with three averages, and 2) four repetitions of the non-diffusion weighted (b=0) images (three averages per repetition). ADC maps were reconstructed from the DWI sets as described above. SNR maps were generated from the b=0 images by dividing the mean signal intensity at each voxel by the standard deviation (across the four repetitions). The mean ADC, ADC standard deviation ("SD"), and mean SNR were then calculated within the septum and compared between MONO, MOCO and CODE-M1M2 across the ten subjects. Measurements were limited to the septum to remove SNR variations caused by field inhomogeneity in the posterior wall near the lung.

Statistical Analysis

All data were first tested for normality using a skewness and kurtosis test for normality. Variability between groups (e.g. between methods or liver ROIs) was then tested using one-way analysis of variance (ANOVA) (for normal distributions) or Kruskal-Wallis (for non-normal distributions). Variations across cardiac phases were tested using repeated measures ANOVA (normal distributions) or Friedman's test (non-normal distributions). If ANOVA yielded significant differences (P<0.05), pairwise comparisons were made between groups (e.g. MONO vs. CODE) using paired t-tests (normal distributions) or Wilcoxon signed-rank tests (non-normal distributions) at a 0.05 significance level. Multiple comparisons (i.e. between techniques, cardiac phases and liver ROIs) were evaluated using post hoc Holm-Sidak correction.

Example Results

CODE Optimization

Convex optimization reduced the TE for all diffusion encoding strategies, i.e. CODE, CODE-M1, and CODE-M1M2 across a wide range of b-values and EPI readouts. The minimum TE for each strategy over a range of b-values and Tε are plotted in FIGS. 5A-5C. The TE reductions achievable with CODE increased with both longer Tε (i.e., high spatial resolution) and large b-values. Mean TE reductions from CODE, CODE-M1 and CODE-M1M2 were 9.1%, 26.5% and 18.4% respectively compared to MONO, BIPOLAR and MOCO. The maximum respective reductions were 17.2%, 32.6% and 28.0%. Example waveforms for each encoding strategy are shown in FIGS. 1D-1F for b-value=500 s/mm2 and Tε=26.4 ms (~2×2 mm resolution, equivalent to the liver protocols).

For the neuro protocol (Tε=27.1 ms, b=1000 s/mm$^2$) the MONO waveform requires TE=75 ms whereas CODE had TE=67 ms (11% reduction). For the liver protocol (Tε=26.4 ms, b=500 s/mm2) the M1 compensated BIPOLAR waveform requires TE=97 ms whereas CODE-M1 had TE=72 ms (26% reduction). For the cardiac protocol (TE=25.3 ms, b=350 s/mm2) the traditional M1M2 compensated (MOCO) waveform requires TE=93 ms whereas CODE-M1M2 had TE=76 ms (18% reduction).

Phantom Validation

There was good agreement between MONO and CODE for all three sets of protocols across the range of diffusivities in the diffusion phantom (range: $0.3 \times 10^{-3}$ mm$^2$/s to $2.1 \times 10^{-3}$ mm$^2$/s). Regression analysis yielded the following linear fits for each pair of protocols: Neuro—ADCCODE=0.92*ADCMONO+0.06×10$^{-3}$ mm$^2$/s (R$^2$=0.997), Liver—ADCCODE-M1=0.94*ADCMONO+0.07×10$^{-3}$ mm2/s (R$^2$=0.99), Cardiac—ADCCODE-M1M21=1.02*ADCMONO+0.21×10$^{-3}$ mm2/s (R$^2$=0.92).

Concomitant Field Corrections

Figure 6A:
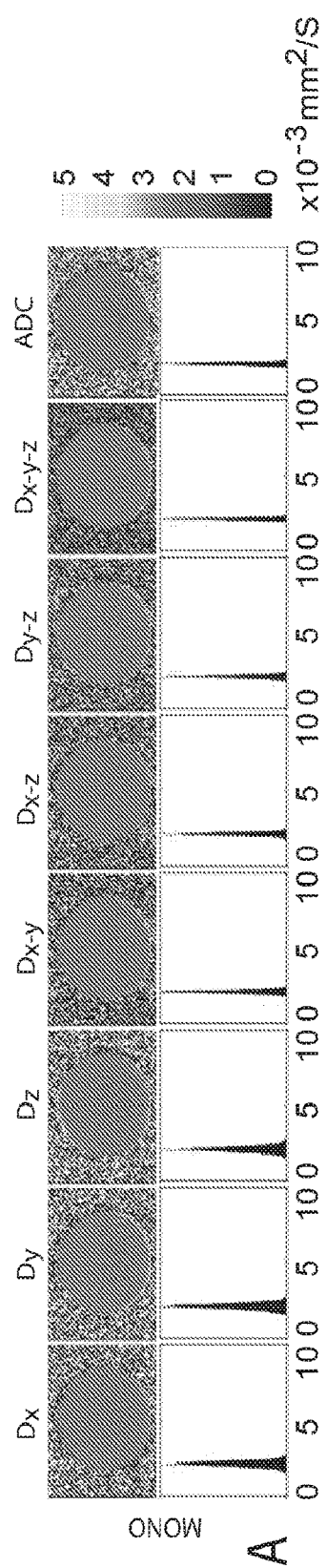
FIG. 6A show graphs indicating measured diffusivity maps along multiple directions, resulting apparent diffusion coefficient ("ADC"), and corresponding histograms obtained using a MONO diffusion-weighted pulse sequence.
Figure 6B:
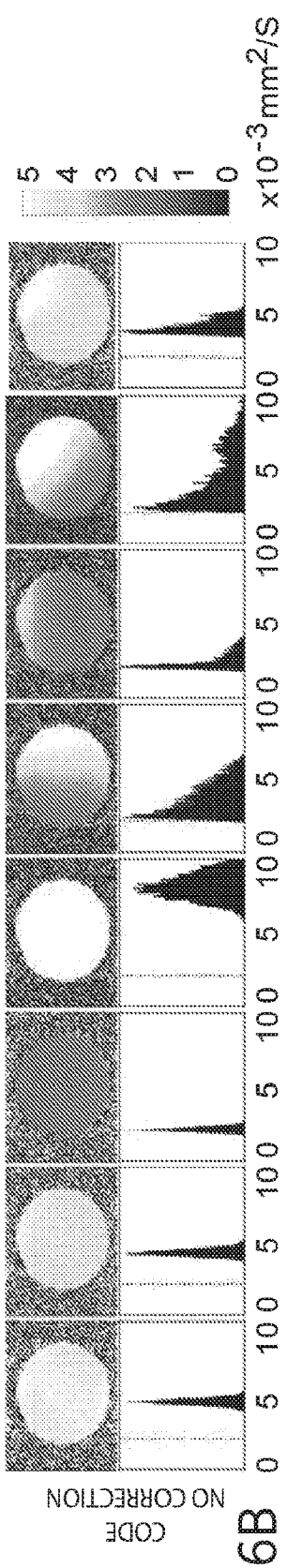
FIG. 6B show graphs indicating measured diffusivity maps along multiple directions, resulting apparent diffusion coefficient ("ADC"), and corresponding histograms obtained using a CODE-$M_1M_2$ diffusion-weighted pulse sequence without concomitant field corrections.
Figure 6C:
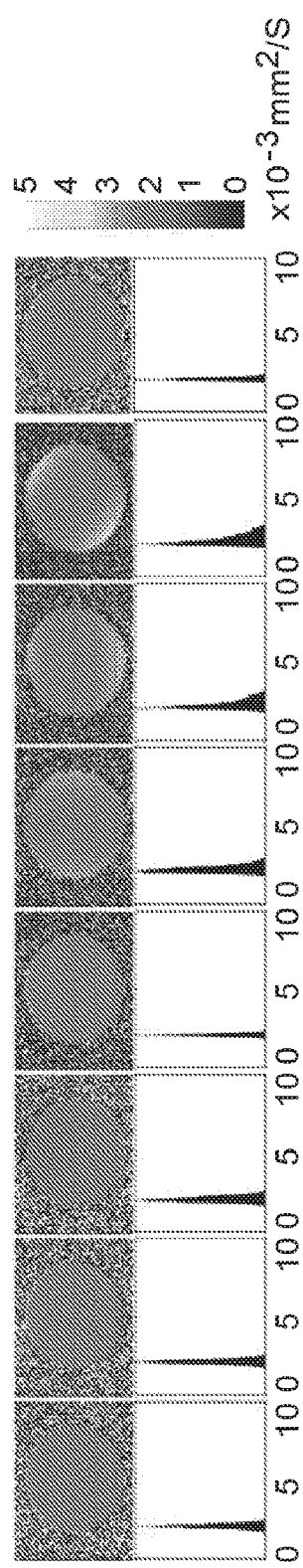
FIG. 6C show graphs indicating measured diffusivity maps along multiple directions, resulting apparent diffusion coefficient ("ADC"), and corresponding histograms obtained using a CODE-$M_1M_2$ diffusion-weighted pulse sequence with concomitant field corrections.

The effect of the prospective concomitant field correction is shown in FIGS. 6A-6C. With MONO encoding (no concomitant fields, no correction) the ADC projections were spatially homogeneous and ADC values were distributed tightly about the free diffusivity of water at room temperature ($D_{H2O} \approx 2.1 \times 10^{-3}$ mm$^2$/s) for all diffusion encoding directions. Without the concomitant field correction, CODE-M1M2 encoding resulted in a large bias and direction-dependent spatial heterogeneity in the ADC projections. The concomitant field correction significantly reduced the error and spatial variation of the ADC projections for all directions. Mean ADC projections measured across all directions by CODE-M1M2 were significantly different from MONO without the correction (4.3±2.2×10$^{-3}$ mm$^2$/s vs. 2.1±0.005×10$^{-3}$ mm$^2$/s, p=0.01), but were not different with the correction (2.1±0.004×10$^{-3}$ mm$^2$/s vs. 2.1±0.005×10$^{-3}$ mm$^2$/s, p=N.S.).

Neuro DWI

Figure 7A:
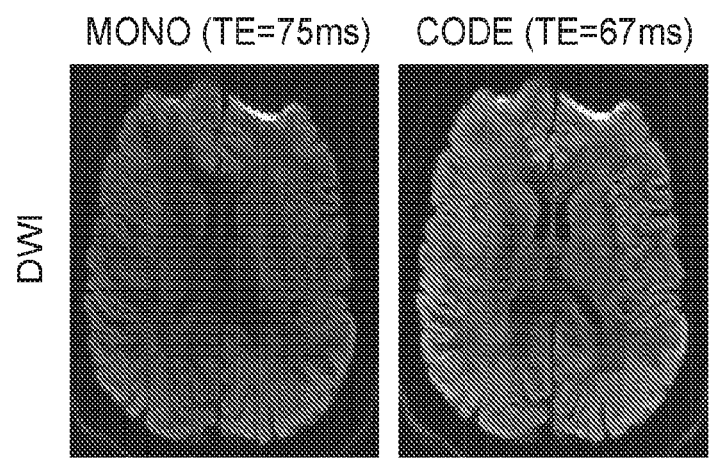
FIG. 7A shows a comparison of diffusion-weighted images acquired from a healthy volunteer's brain using a MONO and a CODE diffusion-weighted pulse sequence, in accordance with aspects of the present disclosure.
Figure 7B:
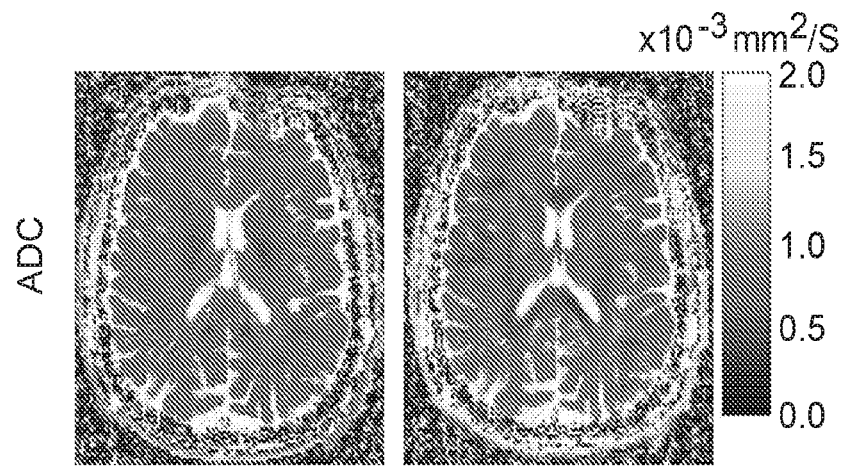
FIG. 7B shows a comparison of ADC maps acquired from a healthy volunteer's brain using a MONO and a CODE diffusion-weighted pulse sequence, in accordance with aspects of the present disclosure.
Figure 7C:
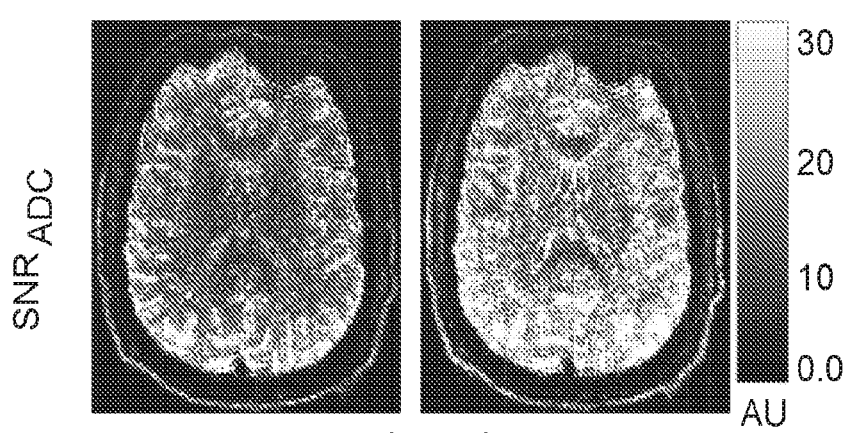
FIG. 7C shows a voxel-wise comparison of signal-to-noise ratio ("SNR") of the ADC maps of FIG. 7B.

The results from the neuro acquisitions are shown in FIGS. 7A-7C. CODE encoding reduced the TE by 11% as compared to MONO (from 75 ms to 67 ms), which resulted in ADC maps with higher SNR (FIG. 7C). The mean global SNR of the ADC maps were 35% higher with CODE than MONO (19.5±2.5 vs. 14.5±1.9, P<0.0001) across the ten volunteers scanned.

TABLE 2

Mean ADC values measured in the four liver ROIs (LL—Left lobe, ML—Middle lobe, SR—Superior right, and IR—Inferior right).

| | $ADC_{LL}$ | $ADC_{ML}$ | $ADC_{SR}$ | $ADC_{IR}$ |
|---|---|---|---|---|
| MONO | 2.1 ± 0.3† | 2.0 ± 0.5† | 1.5 ± 0.3 | 1.5 ± 0.3 |
| BIPOLAR | 1.5 ± 0.6* | 1.2 ± 0.4* | 1.3 ± 0.4 | 1.2 ± 0.5 |
| CODE-M$_1$ | 1.3 ± 0.2* | 1.2 ± 0.1* | 1.3 ± 0.2* | 1.3 ± 0.2 |

†Indicates mean ADCs that are significantly different from ADCIR (p < 0.003).
*Indicates that mean ADCs are significantly different from MONO.

Liver DWI

Figure 8A:
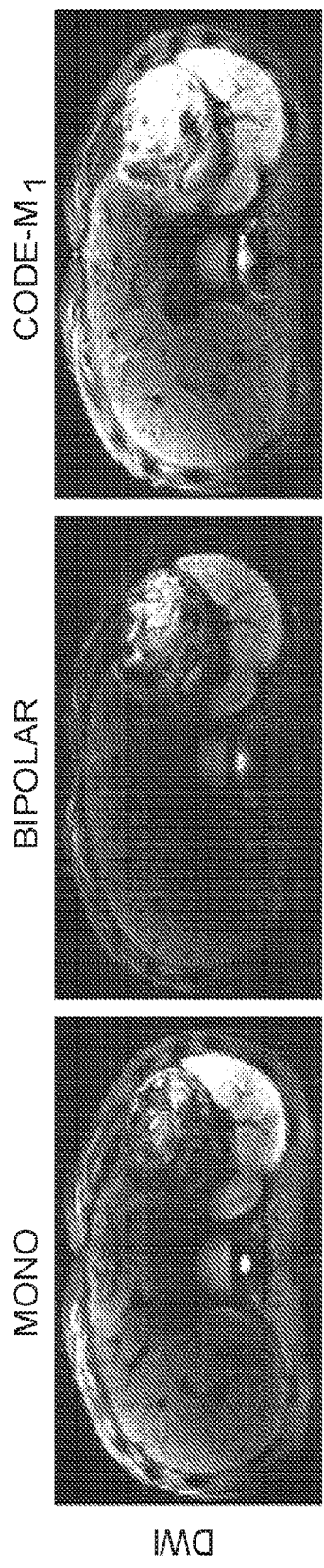
FIG. 8A shows axial diffusion-weighted images of a healthy volunteer's liver acquired using MONO, BIPOLAR and CODE-$M_1$ diffusion-weighted pulse sequences, in accordance with aspects of the present disclosure.
Figure 8B:
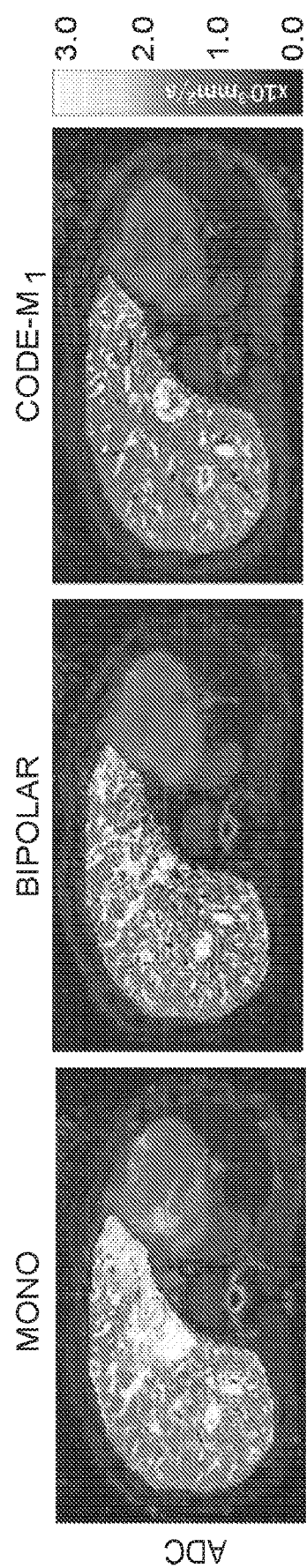
FIG. 8B shows axial ADC maps corresponding to the diffusion-weighted images of FIG. 8A, in accordance with aspects of the present disclosure.
Figure 8C:
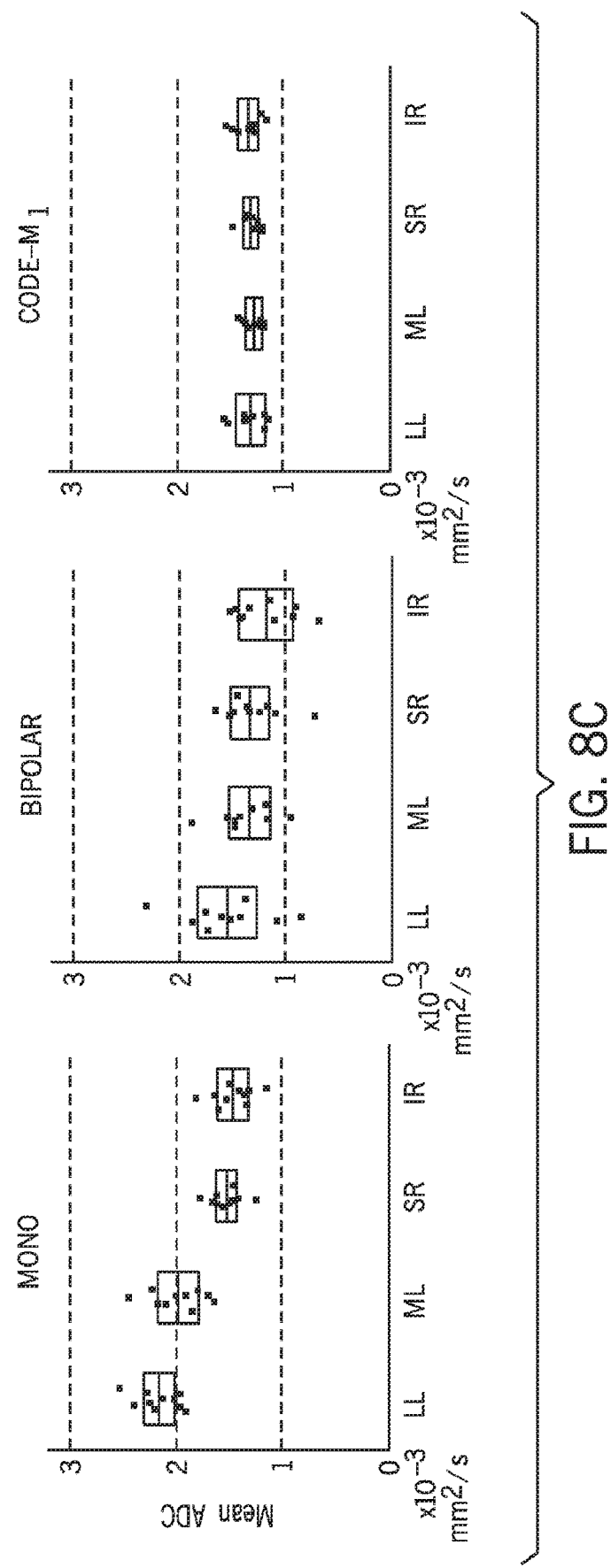
FIG. 8C shows graphs comparing mean ADC values for the liver of 10 volunteers for left lobe ("LL"), middle left ("ML"), superior right ("SR") lobe, and inferior right ("IR") lobe regions of interest ("ROIs"), obtained using MONO, BIPOLAR and CODE-$M_1$ diffusion-weighted pulse sequences, in accordance with aspects of the present disclosure.

Results from the liver acquisitions are shown in FIGS. 8A-8D. MONO encoding resulted in large bulk motion signal dropouts in portions of the liver that are closest to the heart (i.e., superior regions and left lobe, FIG. 8A). These signal dropouts lead to large overestimates of the ADC and were eliminated with BIPOLAR and CODE-M1 encoding (FIG. 8B). Across the ten volunteers the mean ADC measured in left-most ROIs ($ADC_{LL}$ and $ADC_{ML}$) were significantly higher than in the most inferior ROI (i.e., least influenced by cardiac motion, $ADC_{IR}$) with MONO (Table 2, both P<0.004). There was no significant difference between $ADC_{IR}$ and $ADC_{SR}$ with MONO (Table 2, P=N.S.). Notably, there were no significant differences between the four BIPOLAR or CODE-M1 ROIs (Table 2). With MONO the maximum difference between mean ADCs across the four ROIs normalized by the mean ADC in the IR (i.e. [$ADC_{LL}$-$ADC_{IR}$]/$ADC_{IR}$) was 55%; this decreased to 41% with BIPOLAR and 6% with CODE-M1. The mean ADC was also lower with CODE-M1 than MONO in a pairwise comparison to MONO in three of the four ROIs ($ADC_{LL}$, $ADC_{ML}$ and $ADC_{SR}$, all P<0.006). $ADC_{LL}$ and $ADC_{ML}$ were lower with BIPOLAR than MONO (P<0.006), but there was no significant difference in $ADC_{SR}$. There were no significant differences between techniques in $ADC_{IR}$.

Figure 8E:
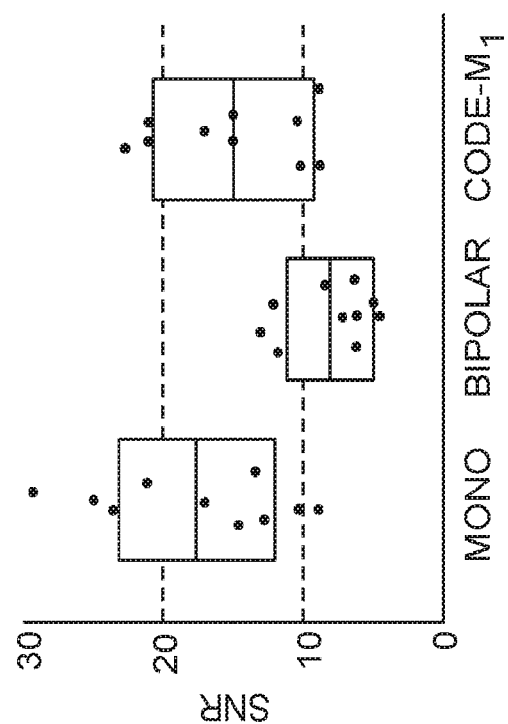
FIG. 8E is a graph comparing mean SNR values within the IR liver ROI across ten volunteers obtained using MONO, BIPOLAR and CODE-$M_1$ diffusion-weighted pulse sequences, in accordance with aspects of the present disclosure.
Figure 8D:
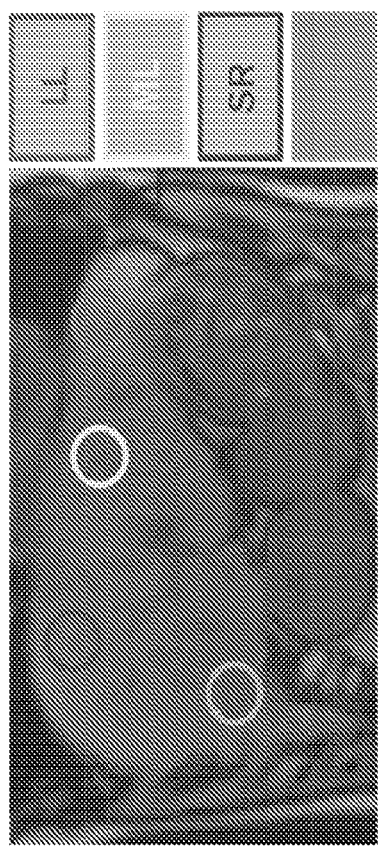
FIG. 8D is a coronal view showing approximate ROIs used in FIG. 8C.

CODE-M1 and MONO both had significantly higher SNR than BIPOLAR (FIG. 8E) (CODE-M1: 14.9±5.3 and MONO: 17.51±6.8 vs. BIPOLAR: 8.0±3.1, both P<0.003). SNR was not significantly different between MONO and CODE-M1.

Cardiac DWI

Figure 9A:
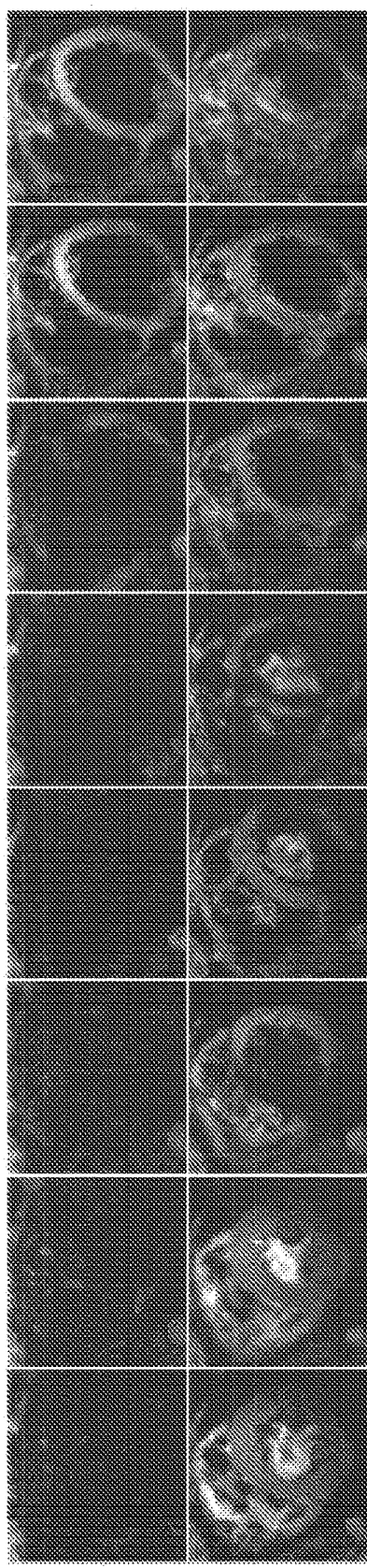
FIG. 9A shows diffusion-weighted images acquired from a healthy volunteer at 8 different cardiac phases using a MONO and CODE-$M_1M_2$ diffusion-weighted pulse sequences, in accordance with aspects of the present disclosure.
Figure 9B:
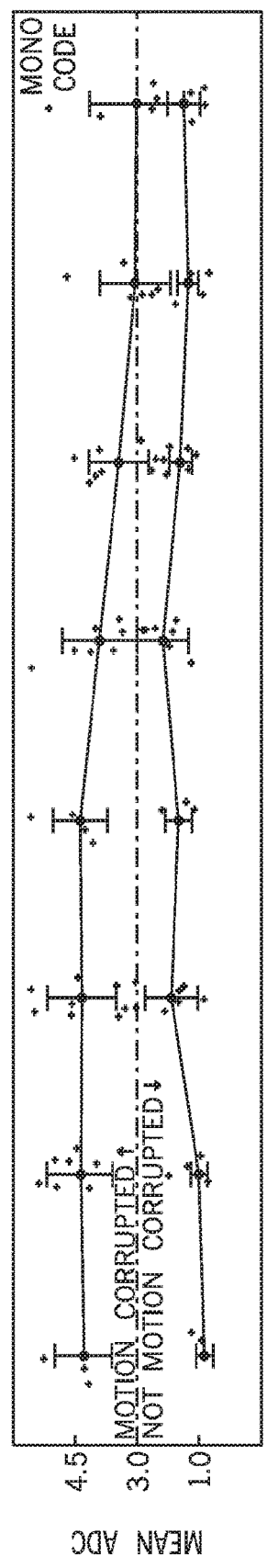
FIG. 9B is a graph showing mean LV ("left ventricle") ADC values for 10 volunteers obtained using MONO, and CODE-$M_1M_2$ diffusion-weighted pulse sequences, in accordance with aspects of the present disclosure.
Figure 9C:
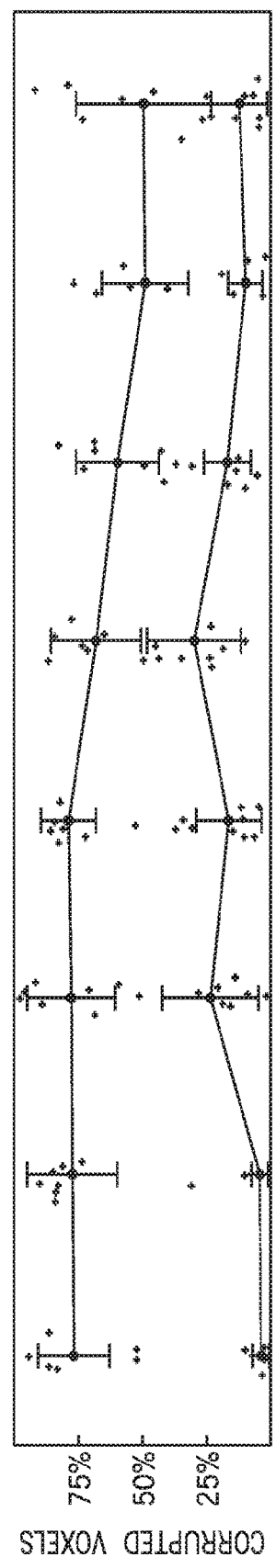
FIG. 9C is a graph comparing the percentage of motion corrupted LV voxels using MONO, and CODE-$M_1M_2$ diffusion-weighted pulse sequences, in accordance with aspects of the present disclosure.

Results from the cardiac DWI acquisitions are shown in FIGS. 9A-9C and 10A-10D. Qualitatively, FIG. 9A demonstrates acceptable DWI when using CODE-M1M2, but unacceptable bulk-motion signal losses when using MONO in most cardiac phases. Mean ADC values were significantly corrupted (>3.0×10$^{-3}$ mm$^2$/s) for 50% of the cardiac phases with MONO (p<0.004) and 0% of the cardiac phases with CODE-M1M2 (p=N.S.) (FIG. 9B). CODE-M1M2 resulted in significantly lower mean ADCs (1.9±0.3 mm$^2$/s vs. 3.8±0.6 mm$^2$/s, p<0.007) and fewer motion corrupted voxels (14% vs. 67%, p<0.0006) than MONO in 100% of cardiac phases (FIGS. 9B and 9C).

Figure 10A:
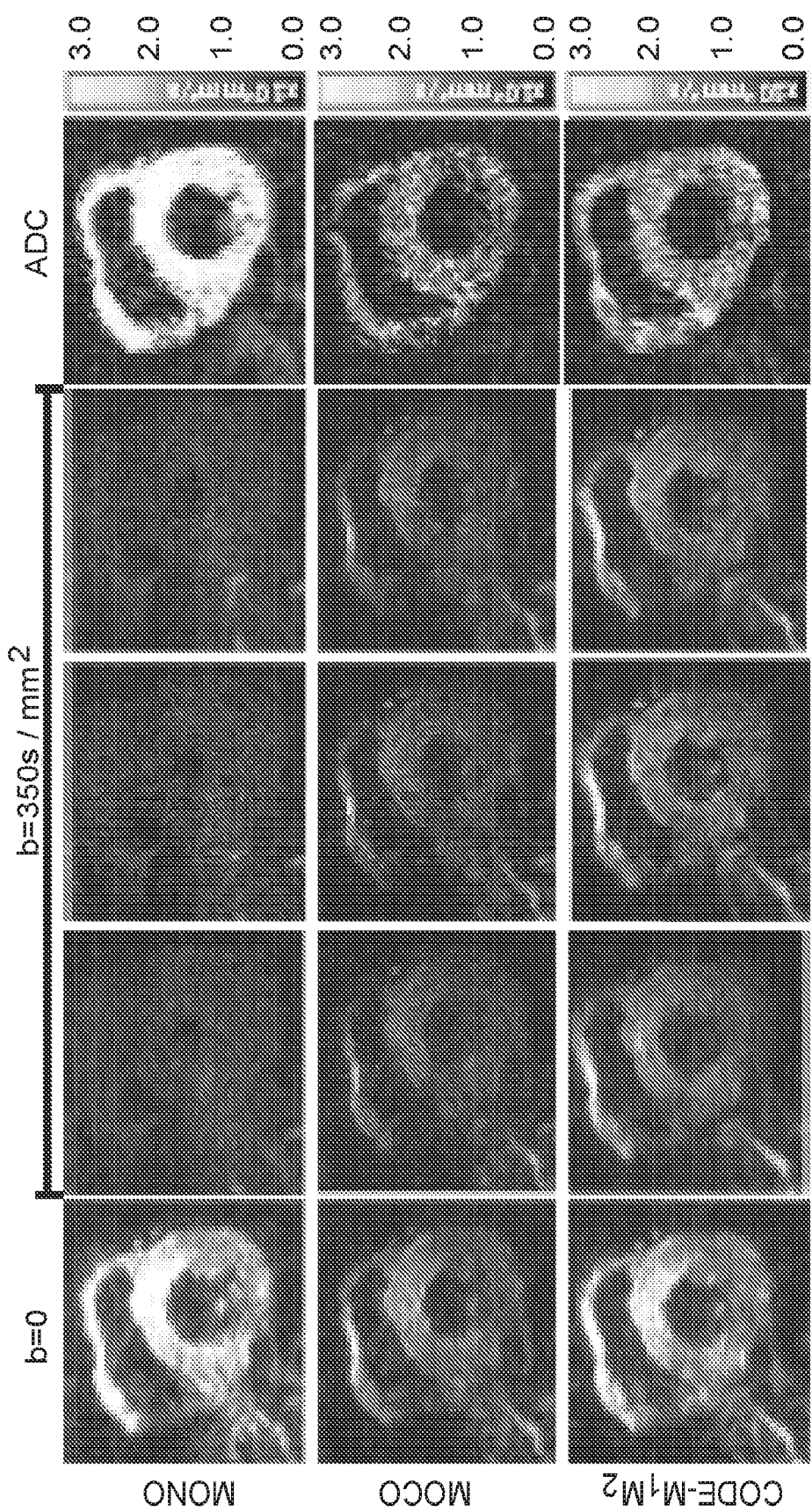
FIG. 10A shows diffusion-weighted images and ADC maps obtained from a healthy volunteer at a single systolic cardiac phase using MONO, MOCO, and CODE-$M_1M_2$ diffusion-weighted pulse sequences, in accordance with aspects of the present disclosure.
Figures 10B, 10C, 10D:
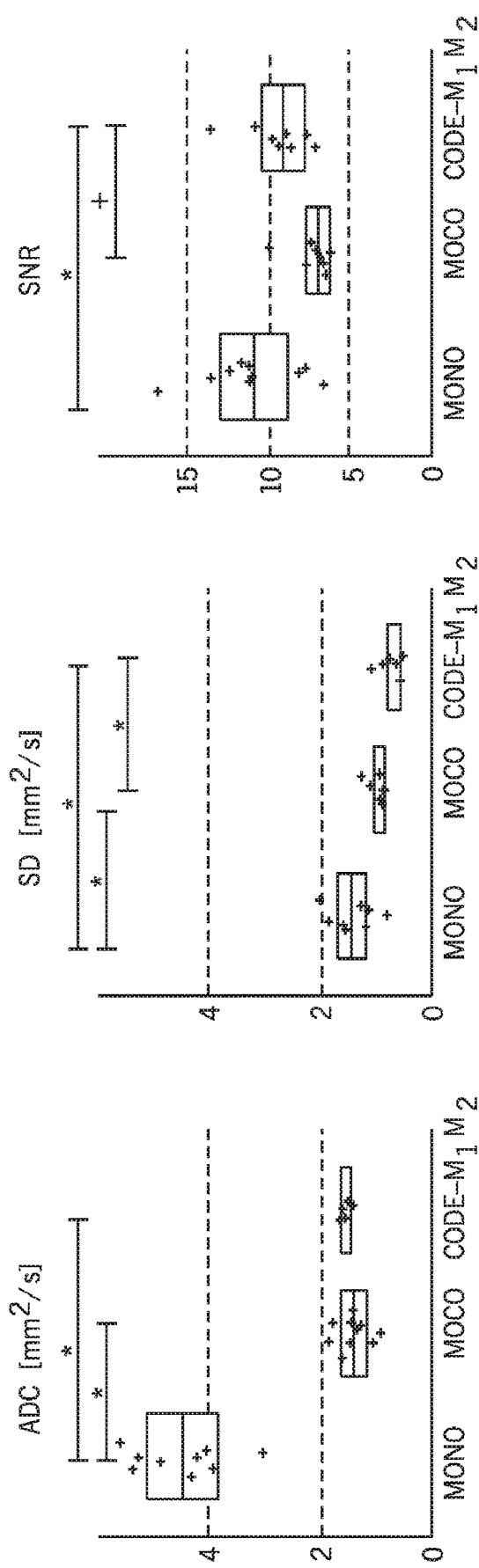
FIG. 10B is a graph comparing mean septal ADC values obtained using MONO, MOCO, and CODE-$M_1M_2$ diffusion-weighted pulse sequences, in accordance with aspects of the present disclosure.
FIG. 10C is a graph comparing standard deviation ("SD") values of the ADC within the septum obtained using MONO, MOCO, and CODE-$M_1M_2$ diffusion-weighted pulse sequences, in accordance with aspects of the present disclosure.
FIG. 10D is a graph comparing SNR values for the b=0 diffusion-weighted images of FIG. 10A obtained using MONO, MOCO, and CODE-$M_1M_2$ diffusion-weighted pulse sequences, in accordance with aspects of the present disclosure.

FIG. 10A demonstrates the improved motion robustness of both MOCO and CODE-M1M2 compared with MONO and also the SNR gains of CODE-M1M2 compared with MOCO. Mean ADCs were not different between CODE-M1M2 and MOCO (1.49±0.2 mm$^2$/s vs. 1.36±0.6 mm$^2$/s, P=N.S.) (FIG. 10B), but CODE-M1M2 had significantly lower ADC variance than MOCO (mean SD=0.67±0.3 vs. 0.91±0.3, P<0.002) (FIG. 10C) and significantly higher SNR (9.07±3.9 vs. 6.95±2.6, P<0.02) (FIG. 10D). MONO had significantly higher SNR (mean SNR=10.96±5.9) than MOCO (mean SNR=6.95±2.6, P<0.002), and slightly higher SNR than CODE-M1M2 (mean SNR=9.07±3.9, P=N.S.), but reported corrupted ADC values that were significantly higher than CODE-M1M2 and MOCO (mean ADC=4.44±1.6 mm$^2$/s, P<1×10$^{-5}$ for MOCO and CODE-M1M2) (FIG. 10B).

Example Discussion

In this study, time-optimal, bulk motion compensated DWI with CODE gradient waveforms was described, implemented, and evaluated in vivo on a clinical scanner. CODE reduced the TE for all combinations of b-value and TE (FIGS. 5A-5C) and the largest reductions were seen for combinations of longer Tc (higher spatial resolution) and larger b-values. The benefit of CODE was greatest for high resolution imaging (long $T_\epsilon$) and was likely to be minimal in applications requiring coarse spatial resolution. Similarly, applications using low b-values may not benefit as much as applications that require large b-values, such as q-space or diffusion spectrum imaging.

Figure 5A:
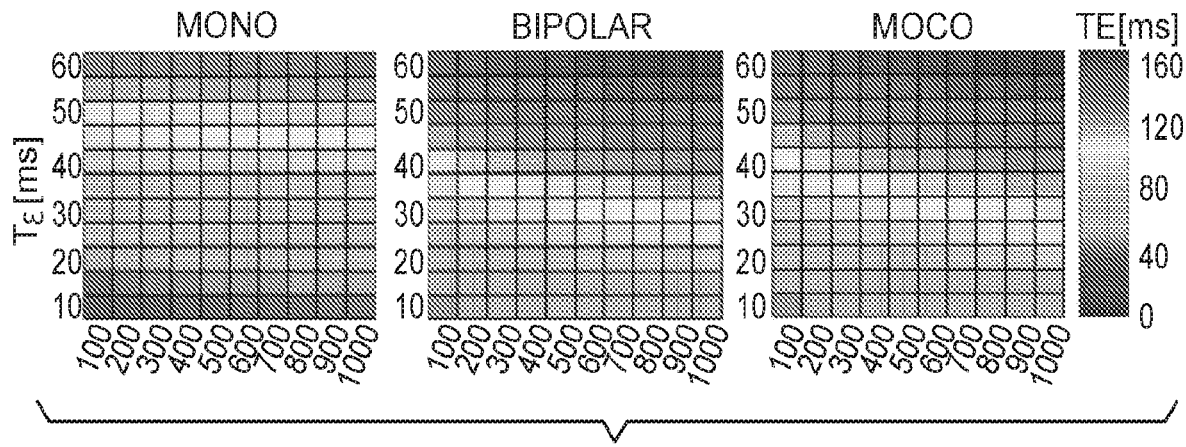
FIG. 5A shows a set of graphs indicating echo times ("TE") as a function of various b-values for a MONO, bipolar and MOCO diffusion-weighted pulse sequences.
Figure 5B:
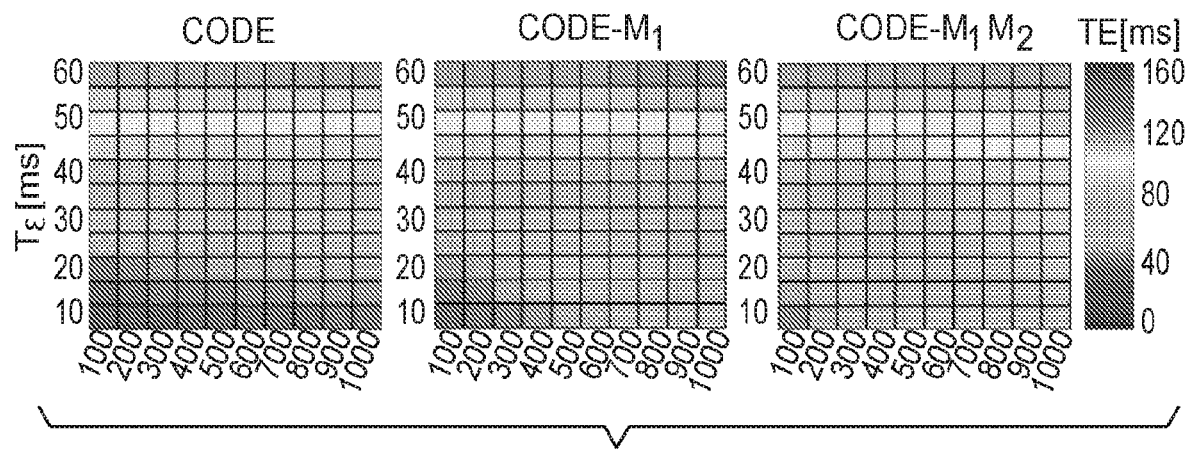
FIG. 5B shows a set of graphs indicating echo times ("TE") as a function of various b-values for the example diffusion-weighted pulse sequences of FIGS. 1D, 1E and 1F.
Figure 5C:
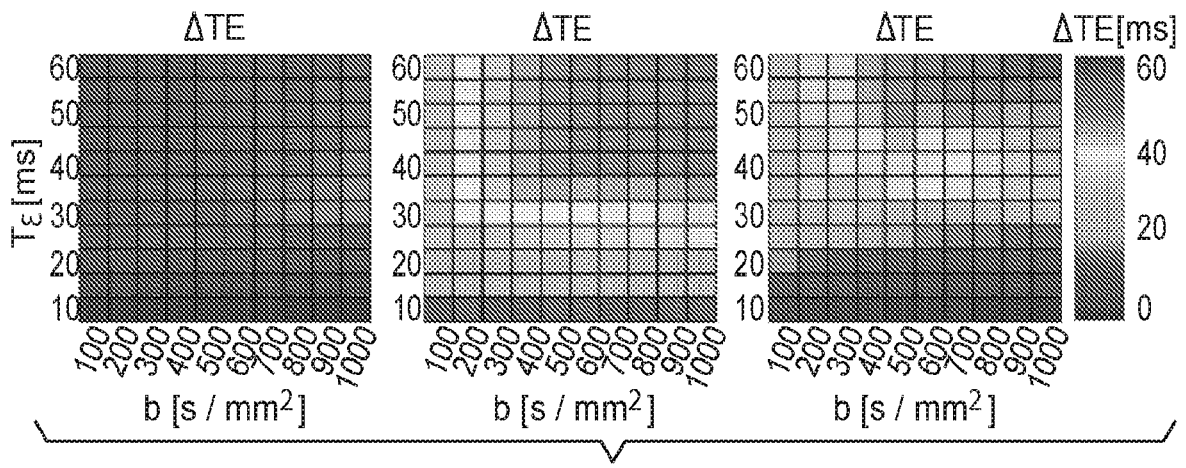
FIG. 5C shows a set of graphs comparing differences in echo times ("$\Delta TE$") for corresponding diffusion-weighted pulse sequences in FIGS. 5A and 5B.

TEs can also be reduced using partial Fourier acquisitions that asymmetrically sample k-space and shorten Tε. Reducing Tε decreases the TE reduction benefit from CODE (FIGS. 5A-5C). However, partial Fourier could lead to signal dropouts due to bulk vibrations or rotations. CODE can achieve TE reductions similar to partial Fourier methods without these adverse effects and while acquiring more k-space lines for improved SNR. For example, neuro CODE permitted full-Fourier with a negligible TE increase compared to MONO with 7/8 PF (67 ms vs. 63 ms), liver CODE-M1 with full-Fourier had a shorter TE than BIPOLAR with 7/8 PF (72 ms vs. 84 ms) and cardiac CODE-M1M2 with full-Fourier had a shorter TE than MOCO with 7/8 PF (76 ms vs. 81 ms). Note that all comparisons assumed two-fold parallel imaging acceleration, which already roughly halves $T_{EPI}$ and $T_\epsilon$.

CODE gradient waveforms were designed to be optimal along any gradient direction and can thus be applied to diffusion tensor imaging (DTI) or higher order q-space sampling. However, because the diffusion encoding direction affects the available gradient amplitude ($G_{max}$ effectively increases when more gradient axes are active simultaneously), the directions to be sampled would be accounted for in the optimization.

While the prospective concomitant field correction significantly reduced image artifacts, some residual errors could still be seen along some diffusion encoding directions, as evidenced by overestimates of diffusivity near the phantom edges (e.g., x-z, y-z, x-y-z in FIGS. 6A-6C). These are likely caused by the linear field approximation made in the correction. However, because these errors varied spatially with different diffusion encoding directions, the final ADC maps had minimal errors throughout the FOV. Hence, more sophisticated corrections may be warranted in DTI and the concomitant field corrections could be included in the optimization.

No apparent eddy current distortions were observed in any of the CODE DWI compared with the non-diffusion weighted images or with MONO, BIPOLAR or MOCO encoding. There were also no issues associated with gradient heating or system instability from any of the CODE sequences.

While the phantom experiments showed good agreement between CODE and MONO in all protocols, CODE-M1M2 showed a slight positive ADC bias and increased variability as compared with MONO. One possible explanation is the lower SNR of this particular protocol caused by its high spatial resolution (1.5 mm in-plane) and relatively long TE (TE=75 ms). Previous reports have shown through simulation that low SNR imaging can lead to overestimates of ADC.

All gradient optimizations were performed with the slew rate constrained to ≤50 T/m/s, which is significantly less than the 200 T/m/s capability of the gradient system. This is a conservative bound that is software-imposed on all diffusion encoding gradients to avoid peripheral nerve stimulation ("PNS"). TEs can be further reduced if this constraint is relaxed, which can likely be done safely. Recent work has shown that a more sophisticated PNS model based on nerve response functions can be applied to safely shorten gradient waveforms. It is envisioned that a similar approach can be used in the present CODE framework.

The neuro scans showed that CODE can improve the SNR of ADC maps by reducing TE compared to monopolar encoding at the same b-value. Neuro DWI often uses high spatial resolutions and large b-values (2000 s/mm$^2$ or higher) which limit SNR. This necessitates many signal averages and long scan times. The shortened TEs permitted by CODE can reduce the number of averages needed for acceptable SNR. Note that while only single slice imaging was performed, CODE is fully compatible with 2D multi-slice imaging.

In vivo liver (FIGS. 8A-8E) and cardiac (FIGS. 9A-9C and 10A-10D) scans in healthy volunteers demonstrated the value of bulk motion compensated CODE. The results of this study echo previous reports of M1M2 nulled DWI in the heart, as well as M1 nulled DWI in the liver. The CODE framework was described with reference to SE-EPI DWI. It is envisioned that other diffusion preparation based sequences might also benefit from the present framework. For example, 3D segmented bSSFP with diffusion preparation has a potential image quality advantage over SE-EPI, but also has lower acquisition efficiency and a long diffusion preparation time.

In the liver, CODE-M1 resulted in lower ADC values than MONO in all regions, even in ROIs distal from the heart and ostensibly free of bulk motion (though not significantly different in the most distal ROI). BIPOLAR reported lower ADC values in all four regions (with significant differences in two of the four). Note too that the CODE-M1 and MONO ADC measurements were in agreement in the phantom. This discrepancy is likely due to the perfusion sensitivity in MONO acquisitions that is reduced with CODE-M1 and BIPOLAR. The motion of perfusing blood within liver tissue contributes to the diffusion encoding signal decay with MONO, leading to overestimates of ADC. This effect was reduced in CODE-M1 and BIPOLAR and absent as long as blood velocities are constant during diffusion encoding. All ADC reconstructions assumed a single compartment diffusion model and thus could not distinguish this effect.

The present approach can leverage state-of-the-art gradient hardware that can achieve high gradient amplitudes ($G_{max}$=80 mT/m) and significantly shorten diffusion encoding gradient waveforms. This can appreciably reduce TE and improve bulk motion robustness (reduces the diffusion encoding footprint) as compared to more commonly available systems (typically $G_{max}$=40 mT/m). The benefit of similar maximum gradient amplitude performance for cardiac DWI has been previously demonstrated at 1.5 T. While CODE can be used with any gradient hardware and can reduce TEs compared to symmetric encoding, TEs will be lengthened significantly when using lower gradient amplitudes and/or lower slew rates. In these cases, moment-nulled diffusion encoding may limit SNR or extend the diffusion encoding intervals beyond a point that is practical for clinical use. In fact, acceptable image quality with M1M2 nulled SE-EPI DWI in the heart has not yet been demonstrated with $G_{max}$=40 mT/m. Non-motion compensated CODE (only M0 nulled) can still be used in this case to minimize the temporal footprint of diffusion encoding. In fact, in some conditions (e.g., long $T_e$), CODE converges to the single-sided bipolar waveform (FIG. 1A) which is designed to be a bulk motion management technique.

CODE gradient waveform design was performed herein using MATLAB (2013A, The Mathworks, Nattick, Mass.) running on a MacBook Pro (2.3 Ghz Core i7 with 16 GB RAM) and took between 2 and 5 minutes. This can likely be shortened by converting the optimization software to a faster language and by using a faster computer. In order to have an optimization that is fast enough to be performed during routine clinical exams, it is envisioned that a database of waveforms previously optimized to a wide range of b-values and imaging constraints can be generated and readily accessed on the scanner.

Example Conclusion

CODE DWI reduced TEs for DWI with and without motion compensation compared to conventional encoding waveforms. Implementation on a clinical scanner in healthy volunteers demonstrated that CODE improved the SNR of ADC maps in DWI of the brain while CODE-M1 and CODE-M1M2 improved the bulk motion robustness of DWI and ADC maps in the liver and heart with shorter TEs and consequently higher SNR than existing methods.

Features suitable for such combinations and sub-combinations would be readily apparent to persons skilled in the art upon review of the present application as a whole. The subject matter described herein and in the recited claims intends to cover and embrace all suitable changes in technology.

The invention claimed is:

1. A method for generating images using a magnetic resonance imaging ("MRI") system, the method comprising:
   a) providing a plurality of constraints for imaging a target at a selected diffusion weighting;
   b) applying an optimization framework to generate an optimized diffusion encoding gradient waveform satisfying the plurality of constraints;
   c) performing, using the Mill system, a pulse sequence comprising the optimized diffusion encoding gradient waveform to generate diffusion-weighted data; and
   d) generating at least one image of the target using the diffusion-weighted data.

2. The method of claim 1, wherein the plurality of constraints comprises at least one of at least one of gradient constraints, gradient moment constraints, and hardware constraints.

3. The method of claim 2, wherein the gradient constraints comprise zero gradient values during a radiofrequency ("RF") activity and a readout.

4. The method of claim 2, wherein the gradient moment constraints comprise at least one of a zero moment ("M0"), a first moment ("M1"), a second moment ("M2"), a third moment ("M3") and a fourth moment ("M4") is nulled.

5. The method of claim 1, wherein applying the optimization framework at step b) further comprises performing an iterative process to minimize at least one of timing parameters comprising a gradient duration during a diffusion encoding period and echo time ("TE").

6. The method of claim 1, wherein the target comprises at least one of a cardiac tissue, a liver tissue, and a brain tissue.

7. The method of claim 1, wherein the pulse sequence comprises a Spin-Echo Echo Planar Imaging ("SE-EPI") pulse sequence.

8. The method of claim 7, wherein a timing of a readout in the SE-EPI pulse sequence is configured based on selected field-of-view, readout bandwidth, and spatial resolution.

9. The method of claim 1, wherein the method further comprises applying the optimized diffusion encoding gradient waveform along one or more gradient field directions.

10. The method of claim 1, wherein the at least one image comprises at least one of a diffusion-weighted image ("DWI"), an apparent diffusion coefficient ("ADC") map, a diffusion tensor image ("DTI"), and a q-space image.

11. A magnetic resonance imaging ("MRI") system comprising:
   a magnet system configured to generate a polarizing magnetic field about at least a region of interest ("ROI") of a subject arranged in the MRI system;
   a plurality of gradient coils configured to apply a gradient field with respect to the polarizing magnetic field;
   a radio frequency ("RF") system configured to apply RF excitation fields to the subject and acquire MR image data therefrom; and
   a computer programmed to:

receive an indication of a plurality of constraints for imaging the ROI at a selected diffusion weighting;

apply an optimization framework to generate an optimized diffusion encoding gradient waveform satisfying the plurality of constraints;

direct the plurality of gradient coils and RF system to perform a pulse sequence comprising the optimized diffusion encoding gradient waveform to generate diffusion-weighted data; and generate at least one image of the target using the diffusion-weighted data.

12. The system of claim 11, wherein the plurality of constraints comprises at least one of at least one of gradient constraints, gradient moment constraints, and hardware constraints.

13. The system of claim 12, wherein the gradient constraints comprise zero gradient values during a radiofrequency ("RF") activity and a readout.

14. The system of claim 12, wherein the gradient moment constraints comprise at least one of a zero moment ("M0"), a first moment ("M1"), a second moment ("M2"), a third moment ("M3") and a fourth moment ("M4") is nulled.

15. The system of claim 11, wherein computer is further programmed to perform an iterative process to minimize at least one of timing parameters comprising a gradient duration during a diffusion encoding period and echo time ("TE").

16. The system of claim 11, wherein the ROI comprises at least one of a cardiac tissue, a liver tissue, and a brain tissue.

17. The system of claim 11, wherein computer is further programmed to perform a Spin-Echo Echo Planar Imaging ("SE-EPI") pulse sequence.

18. The system of claim 17, wherein a timing of a readout in the SE-EPI pulse sequence is configured based on selected field-of-view, readout bandwidth, and spatial resolution.

19. The system of claim 11, wherein the computer is further programmed to apply the optimized diffusion encoding gradient waveform along one or more gradient field directions.

20. The system of claim 11, wherein the at least one image comprises at least one of a diffusion-weighted image ("DWI"), an apparent diffusion coefficient ("ADC") map, a diffusion tensor image ("DTI"), and a q-space image.

21. The system of claim 11, wherein the optimization framework comprises a convex optimization framework or a non-convex optimization framework.

* * * * *